(12) United States Patent
Avenson et al.

(10) Patent No.: US 9,702,992 B2
(45) Date of Patent: Jul. 11, 2017

(54) CLOSED LOOP CONTROL TECHNIQUES FOR DISPLACEMENT SENSORS WITH OPTICAL READOUT

(71) Applicants: SILICON AUDIO SEISMIC, LLC, Austin, TX (US); Bradley Dean Avenson, Pflugerville, TX (US); Matthew Raymon Christensen, Austin, TX (US); Caesar Theodore Garcia, Austin, TX (US); Neal Allen Hall, Austin, TX (US); Abiden Guclu Onaran, Austin, TX (US); James Coe Schlicher, Los Ranchos, NM (US); Ahmad Zaatari, Austin, TX (US)

(72) Inventors: Bradley Dean Avenson, Pflugerville, TX (US); Matthew Raymon Christensen, Austin, TX (US); Caesar Theodore Garcia, Austin, TX (US); Neal Allen Hall, Austin, TX (US); Abidin Guclu Onaran, Austin, TX (US); James Coe Schlicher, Los Ranchos, NM (US); Ahmad Zaatari, Austin, TX (US)

(73) Assignee: SILICON AUDIO SEISMIC, LLC, Austin, TX (US)

( * ) Notice: Subject to any disclaimer, the term of this patent is extended or adjusted under 35 U.S.C. 154(b) by 100 days.

(21) Appl. No.: 14/434,006

(22) PCT Filed: Mar. 15, 2013

(86) PCT No.: PCT/US2013/032584
§ 371 (c)(1),
(2) Date: Apr. 7, 2015

(87) PCT Pub. No.: WO2014/058472
PCT Pub. Date: Apr. 17, 2014

(65) Prior Publication Data
US 2015/0293243 A1 Oct. 15, 2015

Related U.S. Application Data

(60) Provisional application No. 61/712,652, filed on Oct. 11, 2012, provisional application No. 61/721,903, filed on Nov. 2, 2012.

(51) Int. Cl.
*G01V 1/18* (2006.01)
*G01H 9/00* (2006.01)
(Continued)

(52) U.S. Cl.
CPC .............. *G01V 1/181* (2013.01); *G01B 11/00* (2013.01); *G01B 21/16* (2013.01); *G01D 5/20* (2013.01);
(Continued)

(58) Field of Classification Search
CPC .......... G01B 11/00; G01B 21/16; G01H 9/00; G01V 13/00; G01V 1/18; G01V 1/181; G01V 1/182
See application file for complete search history.

(56) References Cited

U.S. PATENT DOCUMENTS 3,582,875 A * 6/1971 Van Wambeck ....... G01V 1/181
367/182

(Continued)

OTHER PUBLICATIONS

Garcia et al. "Micro-Seismometers via Advanced Meso-Scale Fabrication" 2010 Monitoring Research Review: Ground-Based Nuclear Explosion Monitoring Technologies, p. 280-288.

(Continued)

*Primary Examiner* — Natalie Huls
(74) *Attorney, Agent, or Firm* — Foley & Lardner LLP; James De Vellis

(57) ABSTRACT

In one aspect, an apparatus is disclosed comprising: a housing; a proof mass movable within the housing; an
(Continued)

optical element mounted on one of the housing and the proof mass; a reflective element on the other one of the housing and the proof mass; a light source configured to illuminate grating and minor; and one or more detectors configured to detect light incident from the reflective element and the diffractive element and generate a signal indicative of the relative displacement of proof mass and the housing.

18 Claims, 22 Drawing Sheets

(51) Int. Cl.
G01B 11/00 (2006.01)
G01D 5/20 (2006.01)
G01R 27/26 (2006.01)
G01B 21/16 (2006.01)
G01P 15/093 (2006.01)
G01P 15/13 (2006.01)
G01V 13/00 (2006.01)

(52) U.S. Cl.
CPC .............. *G01H 9/00* (2013.01); *G01H 9/006* (2013.01); *G01P 15/093* (2013.01); *G01P 15/132* (2013.01); *G01R 27/2611* (2013.01); *G01V 1/18* (2013.01); *G01V 1/182* (2013.01); *G01V 13/00* (2013.01)

(56) References Cited

U.S. PATENT DOCUMENTS

| | | | | |
|---|---|---|---|---|
| 4,159,464 A * | 6/1979 | Hall, Jr. | ................. | G01V 1/181 367/182 |
| 4,285,054 A * | 8/1981 | McNeel | ................. | G01V 1/181 267/161 |
| 5,119,345 A * | 6/1992 | Woo | ................. | G01V 1/181 29/594 |
| 5,134,594 A | 7/1992 | Woo | | |
| 7,646,670 B2 * | 1/2010 | Maxwell | ................. | G01V 1/16 181/122 |
| 2005/0068851 A1* | 3/2005 | Schleisiek | ............. | G01V 1/181 367/182 |
| 2011/0182140 A1* | 7/2011 | Lambert | ................. | G01V 1/36 367/24 |
| 2012/0247213 A1* | 10/2012 | Zumberge | ................ | G01H 9/00 73/653 |
| 2014/0083186 A1* | 3/2014 | Levitt | ...................... | G01V 7/00 73/382 R |
| 2014/0112094 A1* | 4/2014 | Fernihough | ............ | G01V 1/181 367/7 |
| 2014/0294227 A1* | 10/2014 | Fu | ............................. | B06B 1/04 381/401 |
| 2015/0035544 A1* | 2/2015 | Onaran | ..................... | G01V 1/18 324/602 |
| 2015/0115145 A1* | 4/2015 | Edwards | .................. | G01D 5/34 250/256 |
| 2016/0116499 A1* | 4/2016 | Thompson | ............. | G01P 21/00 73/1.41 |

OTHER PUBLICATIONS

International Search Report for PCT/US2013/032584 dated May 3, 2013.
Written Opinion for PCT/US2013/032584 dated May 3, 2013.
Hall, Neal A., "Micro-Seismometers via Advanced Mesoscale Fabrication," 2008 Monitoring Research Review: Ground-Based Nuclear Explosion Monitoring Technologies, 2008.
Office Action and Search Report for RU 2015112966 dated Oct. 28, 2016, with English translation.
Office Action for CN 2013800533137 issued Jan. 22, 2017.

* cited by examiner

CLOSED LOOP CONTROL TECHNIQUES FOR DISPLACEMENT SENSORS WITH OPTICAL READOUT

CROSS REFERENCE TO RELATED APPLICATIONS

The current application is the U.S. National Stage of International Patent Application Number PCT/US2013/032584, filed Mar. 15, 2013, which claims the benefit of U.S. Provisional Patent Application No. 61/721,903, filed Nov. 2, 2012, and U.S. Provisional Patent Application No. 61/712,652, filed Oct. 11, 2012, the entire contents of each of which are incorporated herein by reference.

The current application is also related to U.S. Patent Publication Number 2011/0194711 published Aug. 11, 2011, U.S. Patent Publication Number 2011/0194857 published Aug. 11, 2011, U.S. Pat. No. 7,116,430 granted Oct. 3, 2006, U.S. Pat. No. 7,485,847 granted Feb. 3, 2009, U.S. Pat. No. 6,643,025 granted Nov. 4, 2003, and U.S. Pat. No. 6,753,969 granted Jun. 22, 2004 the entire contents of each of which are incorporated herein by reference.

BACKGROUND

The following section is presented for informational purposes only. The inclusion of material in this section should not be considered to be an admission that such material is prior art to the present application.

Some embodiments disclosed herein are directed to systems, devices, and methods for seismic sensing, e.g., suitable for use as a geophone. A geophone is a device that converts ground movement (displacement, velocity, or acceleration) into an electrical signal (e.g., a voltage) that may be recorded, e.g., at a recording station or in on board memory in a sensor package. The deviation of this measured voltage from the base line is called the seismic response and is analyzed to determine the underground structure of the earth.

Geophones may be passive analog devices that include, e.g., a spring-mounted magnetic mass moving within a wire coil to generate an electrical signal. Some geophones may be based on microelectromechanical systems (MEMS) technology which generates an electrical response to ground motion through an active feedback circuit to maintain the position of a small piece of silicon.

The response of a coil/magnet geophone may be proportional to ground velocity, while MEMS devices may respond proportional to acceleration. MEMS devices may have a higher noise level than coil/magnet geophones and thus may be limited to use in strong motion or active seismic applications.

Geophones may be used in reflection seismology to record the energy waves reflected by the subsurface geology, e.g., for the purpose of locating subsurface oil or gas deposits.

SUMMARY

The applicants have developed devices, apparatuses, systems, and methods as described herein that apply optical readout techniques to measure the relative displacement of two masses. These techniques may generally be used to obtain information about the relative and/or absolute position and/or motion of these objects including, e.g., speed of motion, velocity, acceleration, etc.

In an illustrative example, the concepts described herein can be applied in a seismic sensor (e.g., a geophone) to measure the relative displacement between two masses, such as a proof-mass (inertial reference frame) and a housing, which may be caused by ground motion. The sensor of the present disclosure can be configured, e.g., as an accelerometer or velocity sensor, with an optical detection scheme that may provide highly sensitive readouts of relative displacement.

The optical detection scheme of the sensor may include an interferometric scheme in which light from a source is divided into at least two light rays and caused to travel along at least two different paths. The two different paths may have an optical path length difference that depends on the relative displacement of the proof mass and housing. A photodetector can detect an interference pattern created by combining the divided rays to generate a signal indicative of the interference pattern. By processing the resulting optical readout signal, possibly in combination with other signals, the sensor may determine displacement information indicative of the relative displacement of the proof mass and housing.

Various techniques (e.g., closed loop feedback techniques) may be used in conjunction with the optical readout to provide advantageous sensor performance. For example, the output of the sensor may be altered to reduce noise, provide a desired sensing performance such as a desired frequency response curve, increase the sensor's bandwidth, dynamic range, and linearity, achieve critical damping, reduce DC offset and power usage, calibrate, stabilize, flatten the frequency response across a broad range of signal frequencies (e.g., at low frequencies useful for seismic exploration), reduce clip recovery time, etc. Some embodiments of the present disclosure adjust the operating point of the sensor by applying feedback forces to the proof-mass. The feedback forces may be based on the measured displacement signal and may be responsive to, e.g., ground motion or calibration.

At least one aspect of the present disclosure is directed to an apparatus that includes a housing. The apparatus can include a proof mass movable within the housing. The apparatus can also include an optical sensor. The optical sensor can be configured to generate a displacement signal indicative of the relative displacement of the proof mass and the housing.

In one embodiment, the optical sensor includes one or more optical elements. The optical elements can be configured to generate an optical interference pattern indicative of the relative displacement of the proof mass and the housing.

In one embodiment, the apparatus includes a diffractive optical element mounted on one of the housing and the proof mass. The apparatus can also include a reflective element on the other one of the housing and the proof mass. The apparatus can also include a light source configured to illuminate optical element and mirror. The apparatus can also include one or more detectors configured to detect an interference pattern and generate the displacement signal. The interference pattern can be generated by combined light incident from the reflective element and the diffractive element.

In one embodiment, the apparatus includes an electromagnetic device configured to influence the relative motion of the housing and the proof mass. The relative motion can be influenced based at least in part on the displacement signal.

In one embodiment, the electromagnetic device includes a coil. The coil can form at least a portion of the proof mass.

In one embodiment, the apparatus can include a magnet configured to provide a magnetic field within the housing.

In one embodiment, the magnet comprises a permanent magnet.

In one embodiment, the apparatus can include a suspension system that couples the proof mass to the housing.

In one embodiment, the suspension system can include one or more springs.

In one embodiment, the one or more springs can include a spider spring.

In one embodiment, the proof mass can include a bobbin disposed about and free to slide along a core member.

In one embodiment, the bobbin is made of a substantially non-conductive material.

In one embodiment, the reflective element and the diffractive element are each planar members disposed facing each other.

In one embodiment, the apparatus can include at least one actuator configured to control the relative orientation of the planar members.

In one embodiment, the apparatus can include one or more devices configured to prevent the planar members from contacting each other in the presence of a mechanical shock.

In one embodiment, the planar members are separated by a distance of about 50 wavelengths of the light used by the optical sensor.

In one embodiment, the apparatus can include at least two optical sensors configured to generate a displacement signal. The displacement signal can be indicative of the relative displacement of the proof mass and the housing.

In one embodiment, the diffractive element is configured to suppress multiple reflections of light between the reflective element and the diffractive element.

In one embodiment, the apparatus is configured to operate in any spatial orientation relative to the direction of the force of gravity.

At least one aspect of the present disclosure is directed to a seismic node. The seismic node can include at least one seismic sensor, which can include an embodiment of the apparatus.

In one embodiment, the at least one seismic sensor includes at least three seismic sensors that are each oriented transversely to the other sensors.

In one embodiment, the seismic node is an autonomous ocean bottom node.

At least one aspect of the present disclosure is directed to a method. The method includes providing an embodiment of the apparatus and measuring the relative displacement of the proof mass and the housing.

In one embodiment, the method includes coupling the housing to the ground. The method can include detecting seismic motion based at least in part on measuring the relative displacement of the proof mass and the housing.

At least one aspect of the present disclosure is directed to a system for use in seismic signal detection. The system can include an embodiment of the apparatus. The system can also include an electrical circuit configured or designed for providing an electrical signal to the coil.

In one embodiment, the digital signal processor of the system is in communication with the seismic sensor.

In one embodiment, the current input to the coil is comprised of a low frequency tuning component and a dynamic component.

In one embodiment, the current input to the coil is determined by the measured optical signal.

In one embodiment, the current input to the coil causes a force opposing a gravitational force to be exerted on the coil.

At least one aspect of the present disclosure is directed to an apparatus that includes a housing and a proof mass movable within the housing. In some embodiments, the apparatus includes an optical sensor configured to generate a signal indicative of the relative displacement of the proof mass and the housing. The apparatus can include an electromagnetic device configured to influence the relative motion of the housing and the proof mass. The apparatus can include a control system configured to control the electromagnetic device. The control system can control the electromagnetic device, at least in part, based on the signal indicative of the relative displacement of proof mass and the housing.

In one embodiment, the optical sensor includes one or more optical elements. The optical elements can be configured to generate an optical interference pattern indicative of the relative displacement of proof mass and the housing.

In one embodiment, the apparatus includes a diffractive optical element mounted on one of the housing and the proof mass. The apparatus can include a reflective element on the other one of the housing and the proof mass. The apparatus can include a light source configured to illuminate optical element and mirror. The apparatus can include one or more detectors configured to detect an interference pattern and generate a signal indicative of the relative displacement of the proof mass and the housing. The interference pattern can be generated by combined light incident from the reflective element and the diffractive element.

In one embodiment, the control system includes a closed loop feedback control system. The error signal of the closed loop feedback control system can be based at least in part on the signal indicative of the relative displacement of proof mass and the housing.

In one embodiment, the closed loop feedback control system can include a PD controller or a PID controller.

In one embodiment, the control system is configured to selectively control the electromagnetic device to influence the relative displacement of proof mass and the housing. The control system can influence the relative displacement such that motion of the proof mass within the housing corresponds to an over-damped oscillator.

In one embodiment, the signal indicative of the relative displacement of proof mass is a periodic signal as a function of relative displacement. The periodic signal can include a plurality of fringes. The control system can be configured to lock the relative displacement of the proof mass and housing to a range corresponding to a single fringe.

In one embodiment, the single fringe includes the fringe most closely corresponding to the mechanical zero of the proof mass and housing.

In one embodiment, the control system is configured to selectively toggle the polarity of the closed loop control system to cause the system to move from a first state locked to a first fringe to a second state locked to a second fringe. The second fringe can corresponds to a position closer to the mechanical zero of the proof mass and housing system than the second fringe.

In one embodiment, the control system is configured to change the fringe to which the system is locked by applying a signal to the electromagnetic device or by mechanically actuating the proof mass.

In one embodiment, the control system is configured change the fringe to which the system is locked by suspending closed loop control for a period of time and then resuming closed loop control.

In one embodiment, the electromagnetic device can include a coil that forms at least a portion of the proof mass.

In one embodiment, the apparatus includes a magnet configured to provide a magnetic field within the housing.

In one embodiment, the interference pattern can include a zeroth order peak and one or more higher order peaks. The one or more detectors can include a first detector configured to detect the intensity of the zeroth order peak. The apparatus can include at least a second detector configured to detect the intensity of the second order peak.

In one embodiment, the signal indicative of the relative displacement of proof mass and the housing is generated based at least in part on a difference of signals from the first and second detectors.

In one embodiment, the signal from each of the first and second detectors are amplified using separate respective amplifiers.

In one embodiment, the separate respective amplifiers can include variable gain amplifiers.

In one embodiment, the apparatus can include a secondary sensor for detecting the relative position of the proof mass and housing. The secondary detector can have a spatial resolution less than the optical sensor, but greater than a wavelength of light used by the optical sensor.

In one embodiment, the apparatus can include an orientation sensor configured to determine the relative orientation of the proof mass and housing. The operation of the optical sensor can be at least partially controlled based on a signal from the orientation sensor.

In one embodiment, the orientation sensor includes a sensor configured to generate information indicative of a tilt angle of the apparatus.

In one embodiment, the apparatus includes an actuator. The actuator can be controlled based on a signal from the orientation sensor. The actuator can be configured to actuate the relative displacement of the proof mass and housing to influence the performance of the optical sensor.

In one embodiment, the apparatus is configured to operate in any spatial orientation relative to the direction of the force of gravity.

In one embodiment, the control system comprises at least one digital signal processor.

At least one aspect of the present disclosure is directed to a seismic node that includes at least one seismic sensor that includes an embodiment of the apparatus.

In one embodiment of the seismic node, the at least one seismic sensor can include at least three seismic sensors each oriented transversely to the other sensors.

In one embodiment, the seismic node is an autonomous ocean bottom node.

At least one aspect of the present disclosure is directed to a method that includes providing the an embodiment of the apparatus. The method can include using the apparatus to measure the relative displacement of proof mass and the housing.

In one embodiment, the method can include coupling the housing of the apparatus to the ground. The method can also include detecting seismic motion based at least in part on measuring the relative displacement of proof mass and the housing.

In one embodiment of the method, the apparatus is configured to operate at any spatial orientation relative to the ground.

In one embodiment, the method includes placing the apparatus at a location without controlling the orientation of the apparatus at the location.

In one embodiment of the method, the location is an underwater location.

In various embodiments, any of the above described devices, techniques, systems, elements, steps, etc. may be used, either alone, or in any suitable combination.

BRIEF DESCRIPTION OF DRAWINGS

The accompanying drawings are presented for illustrative purposes only and are not intended to be drawn to scale.

DETAILED DESCRIPTION

Devices, apparatuses, systems, and methods disclosed herein apply optical readout techniques to measure the relative displacement of two masses. In an illustrative example, the inventive concepts of the present disclosure can be applied in a seismic sensor (e.g., a geophone) to measure the relative displacement between two masses, such as a proof-mass (inertial reference frame) and a housing, which may be caused by ground motion. The sensor of the present disclosure can be configured, e.g., as an accelerometer or velocity sensor, with an optical detection scheme that may provide highly sensitive readouts of relative displacement.

The optical detection scheme of the sensor may include an interferometric scheme in which light from a source is divided into at least two light rays and caused to travel along at least two different paths (e.g., in a double path interferometer) or a single path (e.g., in a common path interferometer). The two different paths may have an optical path length difference that depends on the relative displacement of the proof mass and housing. A photodetector can detect an interference pattern created by combining the divided rays to generate a signal indicative of the interference pattern. By processing the resulting optical readout signal, possibly in combination with other signals, the sensor may determine displacement information indicative of the relative displacement of the proof mass and housing.

The output of the sensor may be altered for various purposes, including, e.g., to reduce noise, provide a desired sensing performance such as a desired frequency response curve, increase the sensor's bandwidth, dynamic range, and linearity, achieve critical damping, reduce DC offset and power usage, calibration, stability, reduce clip recovery time, etc. Some embodiments of the present disclosure adjust the operating point of the sensor by applying feedback forces to the proof-mass. The feedback forces may be based on the measured displacement signal and may be responsive to, e.g., ground motion or calibration.

Figure 1A:
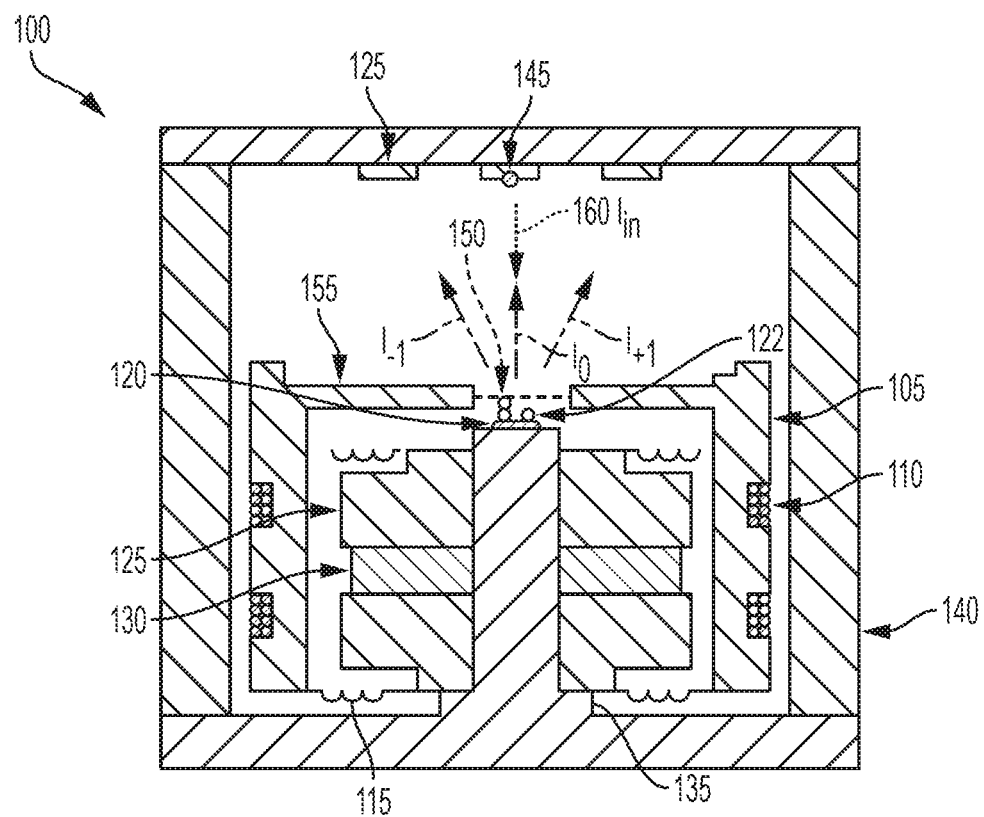
FIG. 1A is an illustrative schematic of an embodiment of a seismic system featuring optical readout.

Referring to FIG. 1A, an illustrative schematic of an embodiment of a seismic system 100 featuring optical readout is shown. The system 100 includes a coil-wrapped bobbin 105 suspended in the presence of a magnetic field which serves as the proof-mass structure. The coil 110 facilitates magnetic actuation and is wound around the bobbin such that there are two electrical connection terminals to the coil 110. In some embodiments, the bobbin 105 is suspended by springs 115 (e.g., a spider spring). For example, the inner ring of the spring 115 may be rigidly coupled to an inner core 135 while the outer ring of the spring 115 may be rigidly coupled to the proof-mass structure or bobbin 105. A magnet 130 (e.g., a ring magnet) and magnet caps 125 can also be rigidly coupled to the inner core 135 which is further rigidly coupled to a housing 140 that serves as the outer casing of system 100. The housing 140 may be magnetically permeable and complete a magnetic circuit. The axially polarized magnetic field supplied by the magnet 130 is directed by the magnet caps 125 to traverse an air gap between the magnet caps 125 and the housing 140 where the coil-bobbin 105 is located. The resulting structure 100 enables relative motion between the coil-bobbin 105 and the housing 140. In operation, when used as a seismic sensor, both the housing 140 and the inner core 135 are rigidly coupled to the ground motion while the proof-mass coil-bobbin 105 is free to move relative to the housing 140. As will be understood by those skilled in the art, in various embodiments other suitable arrangements may be used to provide a proof mass that is free to move in a magnetic field relative to a housing.

To detect and measure the relative displacement of the proof-mass 105 with the housing 140, the system 100 may include an opto-electronic detection scheme. The opto-electronic detection scheme may include an interferometric scheme in which light 160 from a light source 145 (e.g., a laser or light emitting diode, as shown a vertical cavity surface emitting laser—"VCSEL") is divided and caused to travel along at least two different paths (e.g., $I_0$, $I_{+1}$ and $I_{-1}$) having an optical path length difference that depends on the relative displacement of the proof-mass 105 and housing 140. For example, the light source 145 may emit light $I_{in}$ which may travel through a diffraction grating 150 rigidly coupled to the proof-mass 105 via a grating holder 155. The light $I_{in}$ may then reflect off of a mirror 120 that is rigidly coupled to the inner core 135 and travel back through the diffraction grating 150, where the gap height between the mirror 120 and the diffraction grating 150 is d 122. The diffraction grating 150 may divide the light 160 into light rays $I_0$, $I_{+1}$ and $I_{-1}$. A photodetector 125 may detect the resulting interference pattern that depends on the optical path length differences (e.g., differences between at least two of $I_0$, $I_{+1}$ and $I_{-1}$). In some embodiments, mirror motion 120 is therefore coupled to ground motion when the sensor is used in seismic detection. This configuration may be reversed so that the motion of the diffraction grating 150 is coupled to ground motion and the mirror 120 is coupled to proof-mass 105.

In some embodiments, the arrangement shown can produce an interference pattern having a zeroth order peak ($I_0$) and two first order peaks ($I_{+1}$ or $I_{-1}$). In this illustrative example, three photodiodes 125 are positioned to detect the intensity of these peaks. The relative strength of the intensity of the zeroth order peak ($I_0$) in comparison to the intensity of the first order peaks ($I_{+1}$ or $I_{-1}$) may be indicative of the displacement between the proof-mass 105 and housing 140. In other embodiments, the arrangements can produce interference patterns having a plurality of higher order peaks, and a plurality of photodiodes can be configured to detect the peaks.

Figure 1B:
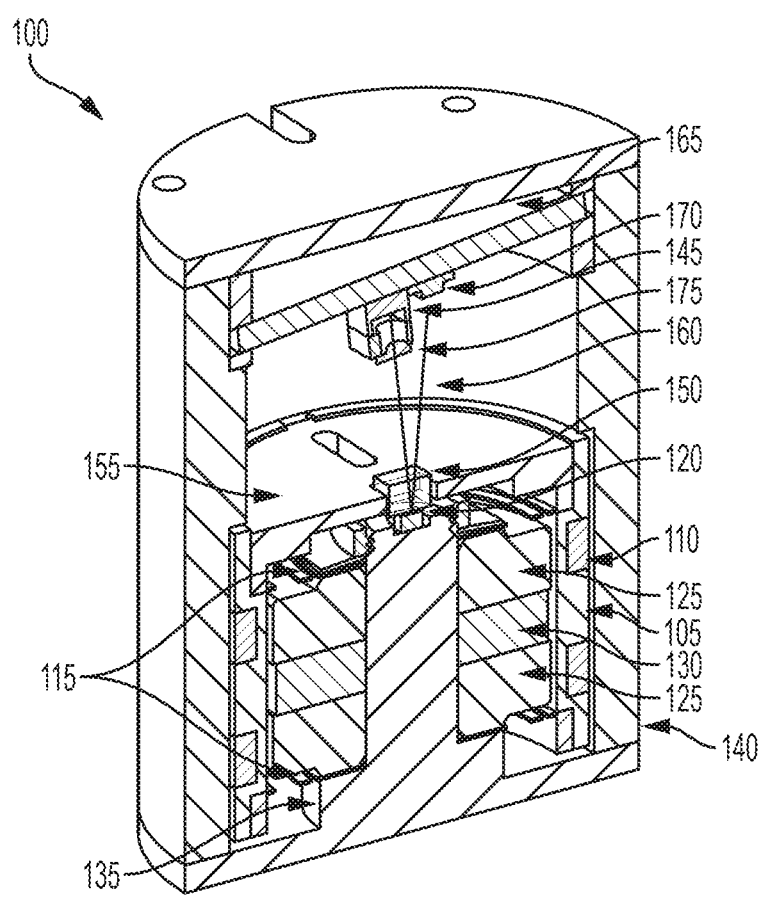
FIG. 1B is an illustrative schematic of a perspective view of an embodiment of a seismic system featuring optical readout.
Figure 1C:
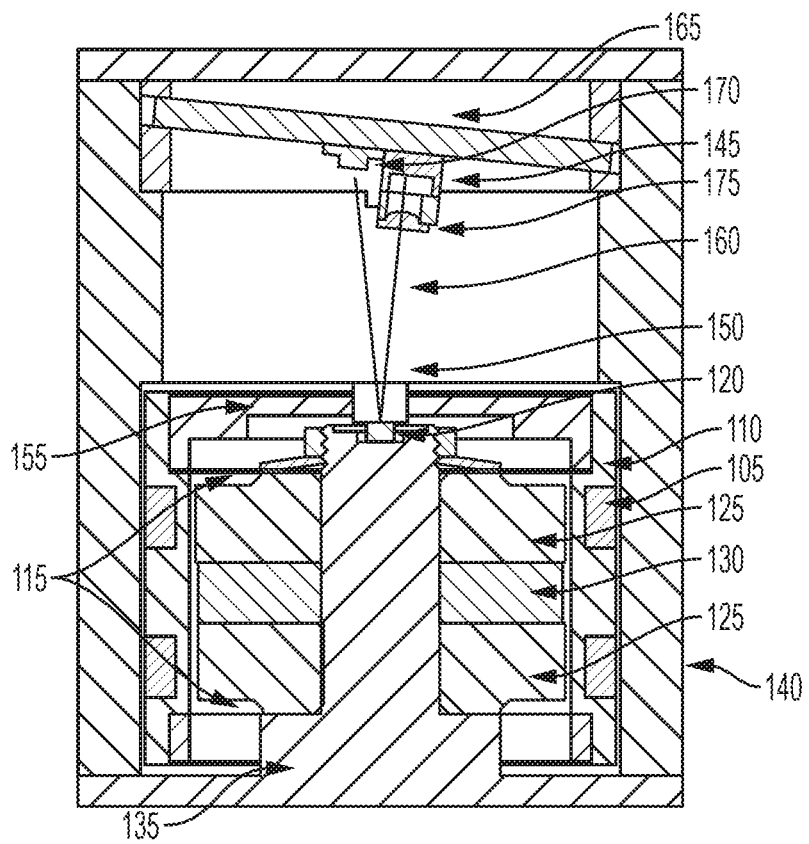
FIG. 1C is an illustrative side cross sectional view of an embodiment of a seismic system featuring optical readout.

FIG. 1B shows a perspective view of system 100 with additional details. FIG. 1C shows a side cross sectional view of the system of FIG. 1B. In brief overview, and in some embodiments, system 100 includes an optoelectronics printed circuit board (PCB) 165 configured to generate (e.g., using a laser or light emitting diode), detect and/or control a light beam. The optoelectronics PCB may be coupled to the housing 140 such that the PCB may tilt based on the orientation of the system 100 with respect to the surface of the ground. The system 100 may include a photodiode array ("PDA") 170 configured to act as a position sensor. The PDA 170 may include a plurality of photodetectors (e.g., photodiodes) capable of converting light into either current or voltage. The system 100 may include a focusing lens 175 configured to focus the light beam 160 emitted from the light source 145 prior to the light beam 160 traveling through the diffraction grating 150.

Still referring to FIGS. 1B and 1C, in further detail, the proof-mass bobbin 105 may include a spindle or cylinder on which the coil 110 can be wound. The bobbin 105 may be made partially, substantially, or even entirely of a non-conductive or weakly conductive material such as aluminum. For example, the bobbin 105 may be made out of a material that may reduce or eliminate eddy-current damping.

The coil 110 may be wrapped or wound around bobbin 105 such that there are two electrical connection terminals to the coil which may receive an electrical current. The coil 110 may be made out of any wire or material capable of being wound around a bobbin and conducting electricity.

The system 100 can include springs 115 configured to suspend the bobbin 105. In some embodiments, the system 100 includes one or more springs 115 coupled to the bottom of the bobbin 105 and a rigid inner core 135, and one or more springs coupled to the top of the bobbin 105 and the rigid inner core 135. In some embodiments, the springs 115 can include, e.g., a spider spring, compression spring, conical compression spring, torsion spring, barrel spring, magazine spring, air spring, leaf spring, micro springs, rubber springs, urethane compression springs, curved or wave washers, clover dome, and/or wave springs. In some embodiments, the spring 115 includes a 3-arm spider spring made from a non-ferrous and/or nonmagnetic material such as Beryllium Copper or Inconel.

In some embodiments, the system 100 includes a mirror 120 rigidly coupled to the inner core 135 that is capable of reflecting the light beam 160 from light source 145. For example, the optical element (e.g. grating) and mirror may be placed in close proximity, e.g., a distance less than 200, less than 100, or less than 50 optical wavelengths of the light used to detect displacement. The mirror 120 may be configured to reflect one or more wavelengths of the light beam 160. In some embodiments, the mirror 120 is a plane mirror which has a flat surface, while in other embodiments the mirror 120 may include a curved mirror (e.g., concave) to focus the light beam 160. Mirror 120 may have a reflectivity of at least 90%, at least 95%, at least 99% or more for wavelengths of light in a selected range. In some embodiments, mirror 120 may include an optical coating in order to alter the way in which the optic reflects light beam 160. For example, the mirror 120 may include a high-reflector coating which can be used to produce mirrors which reflect greater than 99.99% of the received light beam 160 and/or selectively reflect light over some range of wavelengths.

In some embodiments, system 100 includes a magnet 130 rigidly coupled to the inner core 135, which is in turn rigidly coupled to the housing 140. In some embodiments, the magnet 130 may not directly be coupled to the inner core; rather, the magnet 130 may be coupled to the end caps 125 which may be coupled to the inner core 135. The magnet 130 may be configured to supply an axially polarized magnetic field to traverse an air gap between the magnet caps (or "end caps") 125 and the housing 140. The magnet 130 may be configured to generate strong electrical fields in response to motion of the bobbin 105 relative to the housing 140. In some embodiments, the magnet 130 includes a permanent magnet, such as, e.g., a rare earth magnet (e.g., Neodynium Iron Boron, Samarium Cobalt). In some embodiments, the magnet 130 may include a ring magnet wherein the inner ring may be rigidly coupled to the inner core 135. In other embodiments, the magnet 130 may include a disc magnet, cylindrical magnet, block magnet, cup magnet, or a custom shape magnet configured to provide a magnet field that enables the functionality disclosed herein.

In some embodiments, magnet caps or end caps 125 may be placed above and/or below the magnet 130. The end caps 125 may be coupled to the inner core 135 and/or magnet 130. In some embodiments, the magnet caps 125 is configured to direct a magnet field supplied by magnet 130 to traverse an air gap between the end caps 125 and the housing 140 where the bobbin 105 is located. The end caps 125 may configured in various shapes such that the end cap 125 may be placed above and/or below the magnet 130. For example, if the magnet 130 is a ring magnet, the end cap 125 may be in the shape of a ring similar to that of the magnet 130. However, in various other configurations, the end caps 125 may be configured to provide the functionality disclosed herein without mirroring the shape of magnet 130.

In some embodiments, the system 100 may include an inner core 135. The inner core 135 can be rigidly coupled to the housing 140, magnet 130 and/or end caps 125. In some embodiments, the inner core may be made out of a low magnetic permittivity material such as, e.g., aluminum. The inner core 135 may be configured in various shapes to provide the functionality disclosed herein. For example, the inner core 135 may include an elongated cylindrical portion and a flange coupled to the housing 140.

In some embodiments, the system 100 includes a housing 140 that may function as an outer casing for the sensor. The housing 140 may be made out of magnetically permeable material that is configured to complete a magnet circuit. For example, the housing 140 may have a magnetic permeability, e.g., about unity (e.g., using aluminum) that may be sufficient to support a magnet field provided by magnet 130. In other embodiments, the housing may be made of non-magnetic non-ferrous materials and be configured to provide structural support and/or couple one or more elements of the system 100 to an external environment. For example, the housing 140 may couple a component of the system 100 to external ground motion, wave motion, vibrations, impulses, forces, or any other movements or motion that have an acceleration and/or velocity component.

In some embodiments, the system 100 includes a light source 145 configured to supply a light beam 160 with a wavelength within a range of wavelengths (e.g., 850 nm+/−1 nm). For example, in some embodiments, the light source 145 may include a laser or light emitting diode.

In some embodiments, the light source may be a solid state laser, such a vertical cavity surface emitting laser. In various embodiments any other suitable laser source may be used.

The system 100 may include a diffraction grating 150 configured to affect a light beam 160 supplied by light source 145.

In some embodiments, the system 100 includes a grating holder 155 coupled to the bobbin 105 and configured to hold a diffraction grating 155. The grating holder 155 may move relative to the mirror 120.

In some embodiments, the system 100 includes one or more focusing lenses 175 configured to focus the light beam 160.

In some embodiments, the system 100 includes an optoelectronic PCB 165. In some embodiments, the optoelectronic PCB 165 may be rigidly coupled to the housing 140. In other embodiments, the optoelectronics PCB 165 may be coupled to the housing 140 in a manner that allows for the optoelectronic PCB 165 to tilt or otherwise move relative to the housing 140.

In some embodiments, the system 100 includes a photodiode array 170 coupled to the optoelectronics PCB 165. The photodiode array 170 may be configured to receive one or more light beams 160 reflected from the mirror 120 and further configured to detect an aspect of the received light. For example, the photodiode array 170 may include a plurality of photodetectors configured to detect an intensity of the receive light and also determine a position of the received light. The detected light data may be result in an electric signal (e.g., voltage/current) that can be used to generate an interference pattern. In some embodiments, the photodiode array 170 may include a single dimension of a plurality of photodetectors or photodiodes. In some embodiments, the photodiode may include a semiconductor diode with a PIN junction or p-n junction.

Figure 2:
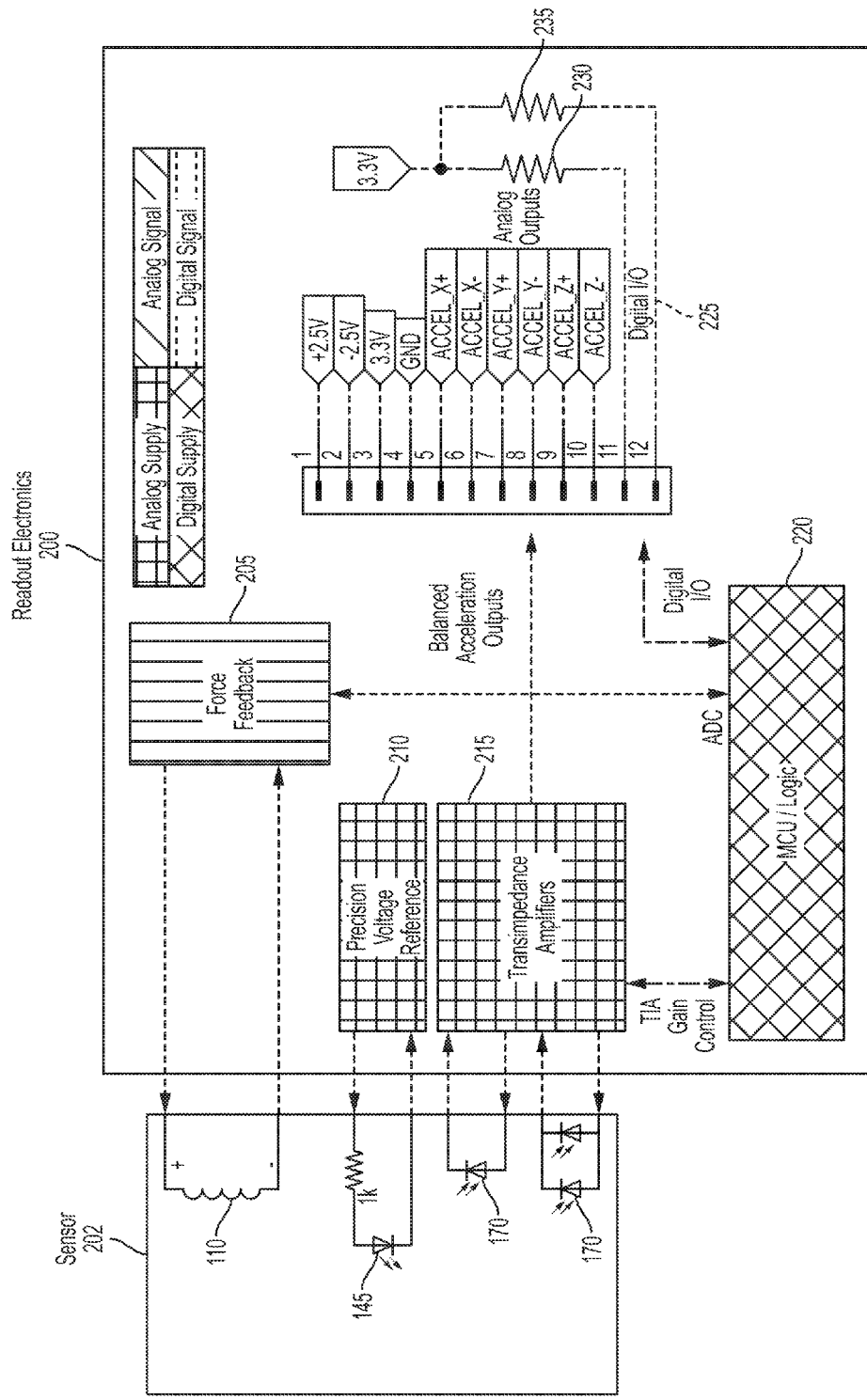
FIG. 2 is an illustrative functional block diagram of an embodiment of a sensor that can be used in a seismic system.

Referring to FIG. 2, an illustrative functional block diagram of some embodiments of the sensors of FIGS. 1A-1B, with emphasis on the readout electronics 200 is shown. The readout electronics 200 may be communicatively and/or electronically coupled to the sensor components 202, which include the coil 110, light source 145, and photodiode array 170. In some embodiments, the signals from the photodiode array 170 are output to readout electronics 200, where the signals are processed to generate a signal indicative of the relative displacement of the proof mass 105 and housing 140 (as shown, an acceleration signal is produced). The two-terminal coil connection 110 (or other suitable electrical connection) can be electrically connected to the readout electronics 200, which can be configured to apply, based on the measured displacement signal, feedback forces to the proof-mass 105 that can adjust the operating point of the sensor.

In some embodiments, the readout electronics includes force feedback circuitry 205 configured to apply feedback forces to the proof-mass 105 based on the measured displacement signal.

In some embodiments, the readout electronics 200 includes one or more precision voltage references 210. The precision voltage reference 210 may internal or external to the readout electronics 200 and/or system 100. The precision voltage reference 210 may be configured to provide a precise voltage reference that may be used by one or more component of the system 100 and/or readout electronics 200. For example, an MCU 220 may utilize a precise voltage to facilitate converting an analog signal to a digital signal (e.g., ADC functionality). In another example, the precision voltage reference 210 may be coupled to the light source 145 via a resistor and provide the light source 145 with power. The precision voltage reference 210 may include one or more components such as, e.g., resistors, inductors, capacitors, op-amps, transistors, semiconductors, etc. configured to provide a precise voltage.

In some embodiments, the readout electronics 200 includes one or more transimpedance amplifiers 215 coupled to one or more photodetectors and/or the photodiode array 170. In some embodiments, the transimpedance amplifiers 215 may be configured to convert current received from the photodiode array 170 to voltage.

In some embodiments, the readout electronics 200 includes a microcontroller unit ("MCU") 220 configured to receive input from one or more component of the readout electronics 200 including, e.g., the transimpendance amplifiers 215, and force feedback circuitry 205 and provide output to same. The MCU 220 may include a plurality of pins to receive and/or output analog and/or digital signals. Analog output pins may include, e.g., a pin for each of a positive and negative acceleration in the X, Y, and Z directions.

In some embodiments, the MCU 220 includes an analog-to-digital converter ("ADC") configured to receive an analog signal (e.g., the continuous optical output voltage/current from a photodiode array 170 and/or transimpedence amplifier 215) and convert the analog signal to a digital number that is proportional to and/or represents the amplitude of the analog signal. In some embodiments, the MCU 220 includes a linear ADC; therefore, the range of input values may have a linear relationship with the output value. The MCU 220 may be configured to sample the analog signal at one or more sample rates including, e.g., 250 Hz, 500 Hz, 1 kHz. The analog signal may be sampled at 24 bit, 26 bit or 32 bit resolution. The sensor may acceleration to voltage with a sensitivity of 5V/g using a supply voltage which may vary from 6V to 17V. The passband of the sensor may be from 0.01 Hz to 3 kHz.

In some embodiments, the MCU 220 may include a proportional-integral-derivative controller ("PID controller") and/or a proportional-derivative controller ("PD controller") or otherwise be configured to provide feedback controller functionality. For example, the MCU 220 may calculate an "error" value as the difference between an output voltage indicative of a measured process variable (e.g., measured displacement of the proof-mass 105 relative to the housing 140) and a desired setpoint (e.g., corresponding to a fringe "lock" and/or mechanical zero). The MCU 220 may attempt to minimize the error by adjusting the process control inputs (e.g., effective spring force applied by coil 110).

Figure 3A:
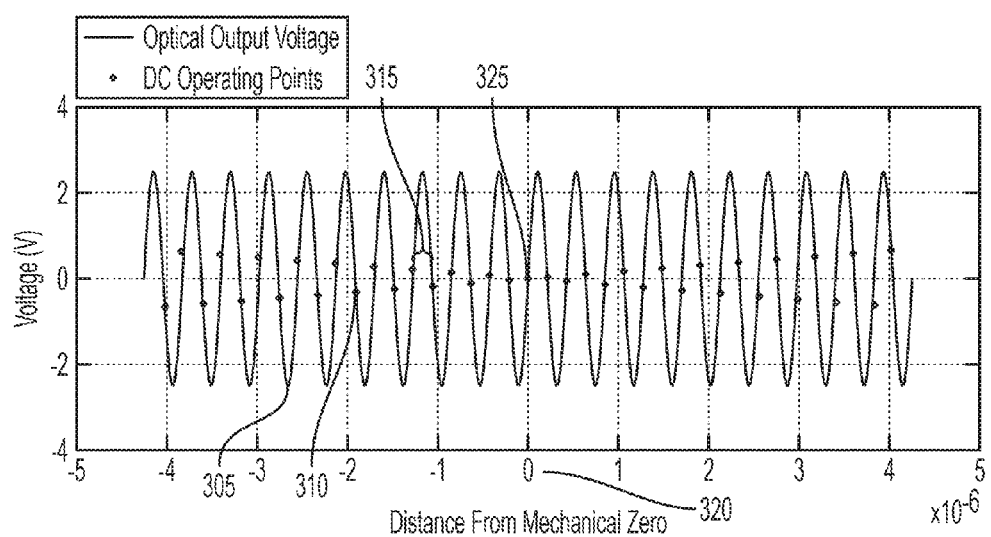
FIGS. 3A & 3B are illustrative plots of the output voltage of a photodiode array as a function of the relative displacement of the proof-mass and housing, in accordance with an embodiment.

In some embodiments, the MCU 220 may be configured to control where on the output voltage curve 305 of FIG. 3A the system 100 is operating.

Referring to FIG. 3A, an illustrative plot of the output voltage 305 of the photodiode array 170 as a function of the relative displacement of the proof-mass 105 and housing 140 is shown. For example, the output voltage 305 may correspond to the relative intensity of the zeroth ($I_0$) and first order diffraction peaks ($I_{-1}$ and $I_{+1}$). The output voltage 305 may be periodic (as shown sinusoidal), with a period that is proportional to the inverse of the wavelength of the light 160 used to generate the interference pattern. As used herein, the term fringe 315 may refer to one half period of the output voltage signal.

In various embodiments, during operation, it may be desirable for the system to operate within a range of displacements corresponding to a single fringe 315. In some embodiments, it may be desirable for the system to operate within a range of displacements corresponding to a portion of a single fringe where the output voltage varies substantially or at least approximately linearly as a function of displacement (as shown by reference 325 of FIG. 3B).

In some embodiments, it may further be desirable for the system to operate within a range of displacements corresponding to a single fringe 315 at mechanical zero 320. For example, a fringe at mechanical zero 320 may result in an optical output voltage of or near zero volts, which may reduce power consumption. As the system 100 operates on fringes farther from mechanical zero, the mechanical spring force increases and therefore DC offset also increases. This increase in DC offset may also cause adverse dynamic range issues in a Analog-to-Digital converter (ADC).

As shown in the plot, the displacement is indexed to the "mechanical zero" 320 of the system 100. When no feedback current is applied to the coil 110, the spring mass system may vibrate due to, e.g., ground motion. In this state, the system 100 may have a relatively high quality ("Q") factor (e.g., an underdamped system with a low damping ratio) and may primarily oscillate at a natural frequency. The average location of the proof-mass 105 is determined by tilt angle, i.e., force of gravity pulling on the spring-mass system along the direction of motion of the system 100. This can be considered the natural resting point of the spring 115 and may be referred to as "mechanical zero" 320. By turning on the feedback control system, as discussed further herein, the Q factor may be lowered, resulting in an overdamped system with a high damping ratio. This may result in a system 100 that may be less susceptible to oscillations due to the impact of noise; e.g., the system may not oscillate or have a minimum oscillation frequency when in equilibrium, and when displaced by (e.g., by ground motion) may return to the equilibrium state via exponential decay. In some embodiments, the system may have a Q factor between the range of 0.1 to 5 (wherein Q factor=1/(2*damping_factor)).

The output voltage response curve 305 shown in FIG. 3A may be an idealized version of a response curve. In some embodiments, the output voltage response curve 305 may be modified, e.g., by an envelope function that depends on the gap distance between the mirror 120 and diffraction grating 150. Accordingly, the fringes 315 may have differing optical modulations. Optical modulation for a given fringe as used herein refers to the peak-to-peak swing of the optical curve normalized to a peak value of the optical curve, typically corresponding to mechanical zero (100% is perfect modulation, above 30% may be advantageous for typical sensor operation). In various embodiments, using the techniques described herein, the system can be locked to a fringe 315 having an optical modulation of at least 30%, 40%, 50%, 60%, 70%, 80%, 90%, 95% or more, e.g., in the range of 30%-100% or any subrange thereof.

In some embodiments a given fringe 315 may have a nonlinearity or other undesirable feature or artifact, e.g., caused by a defect in the optical system.

The amount of proof-mass 105 displacement depends on ground motion, but, in some embodiments, even a quiet environment will likely move the equivalent distance of multiple optical fringes 315 in the absence of force feedback. Accordingly, the feedback coil 110 is used to maintain or "lock" the sensor to a desired operating point and displacement range.

Figure 3B:
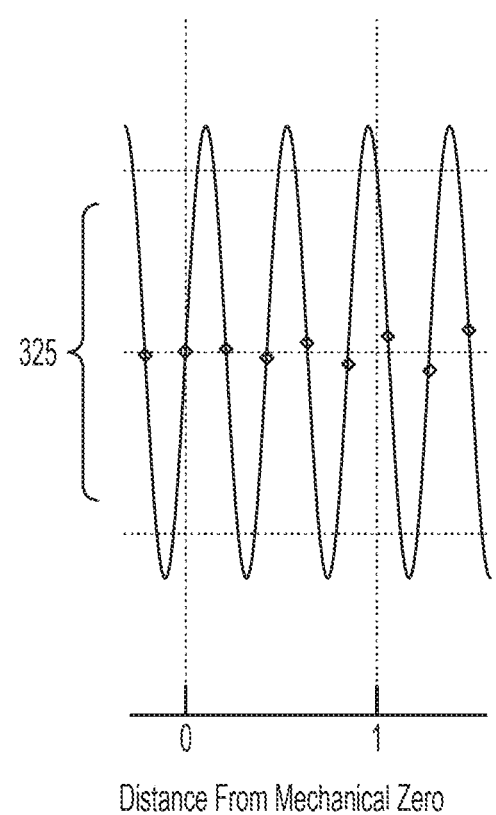
Figure 6:
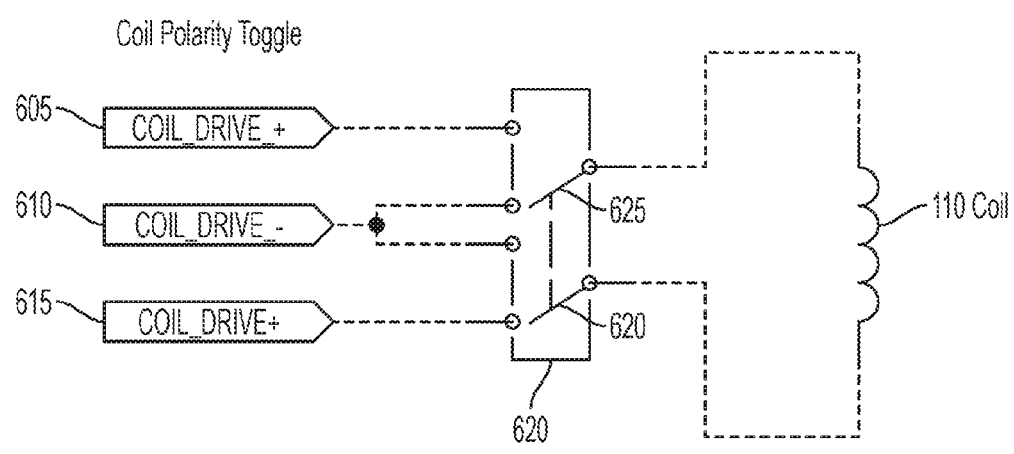
FIG. 6 illustrates an embodiment of an electronic circuit that can provide coil polarity toggling to facilitate fringe selection.
Figure 7:
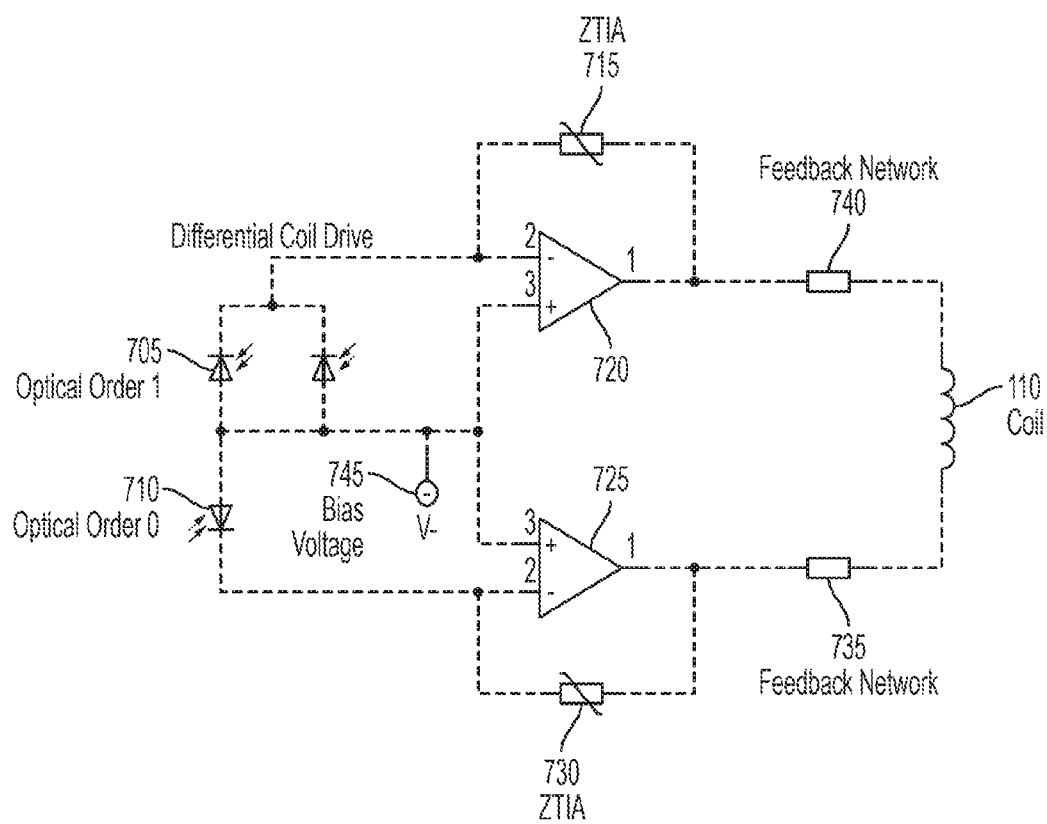
FIGS. 7-9 illustrate circuit implementations for various subtraction schemes in accordance with an embodiment.
Figure 8:
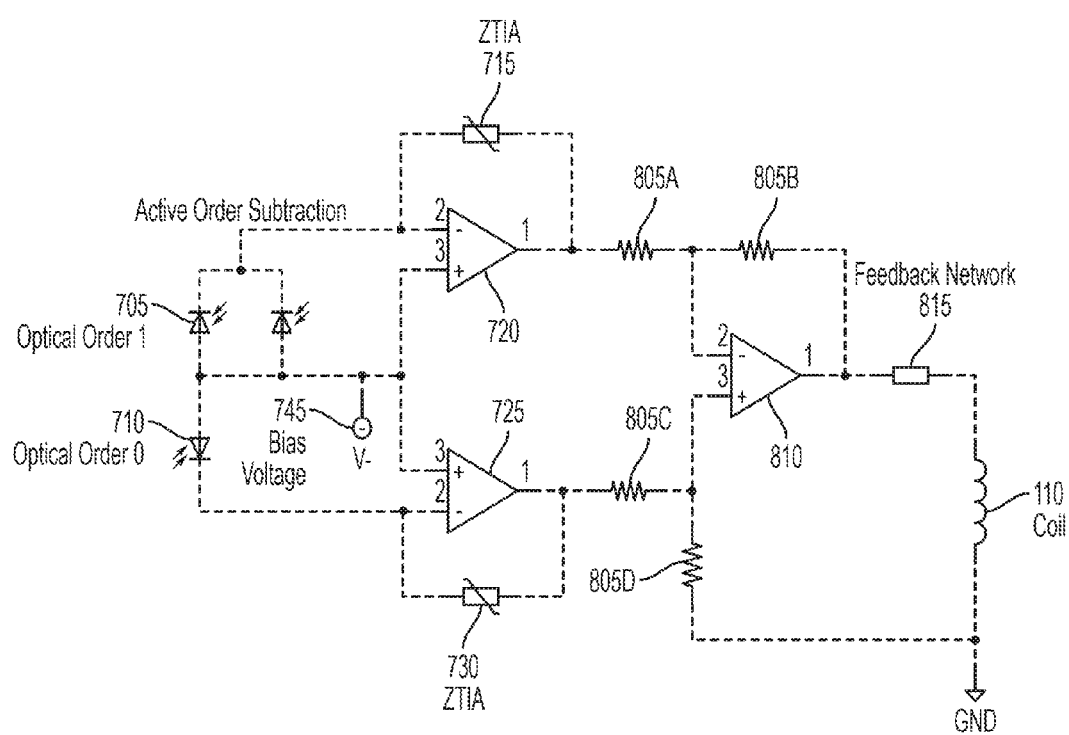

Referring to FIG. 3B, in some embodiments, when the sensor is powered a control system MCU 220 (shown in FIG. 2) may be configured to lock the system 100 on one optical fringe 325. The MCU 220 can provide the functionality of a proportional-differential "PD" controller, a proportional-integral-differential "PID" controller, or other suitable controller. In some embodiments, the controller can be designed to operate on one or more slopes and function in a manner similar to a damped mass-spring system with a natural frequency that is substantially larger than the natural frequency of the open loop system. Note that, in various embodiments, the system can operate on either positive or negative slopes of one fringe 315 in the optical curve, depending on the selected polarity of the feedback loop. Exemplary feedback loop implementations are shown in FIGS. 6-8.

In some embodiments, the initial fringe locked on is determined by the position of the proof-mass 105 when the sensor was powered on. Naturally, it is normally located near mechanical zero, but exact location can vary.

Figure 4:
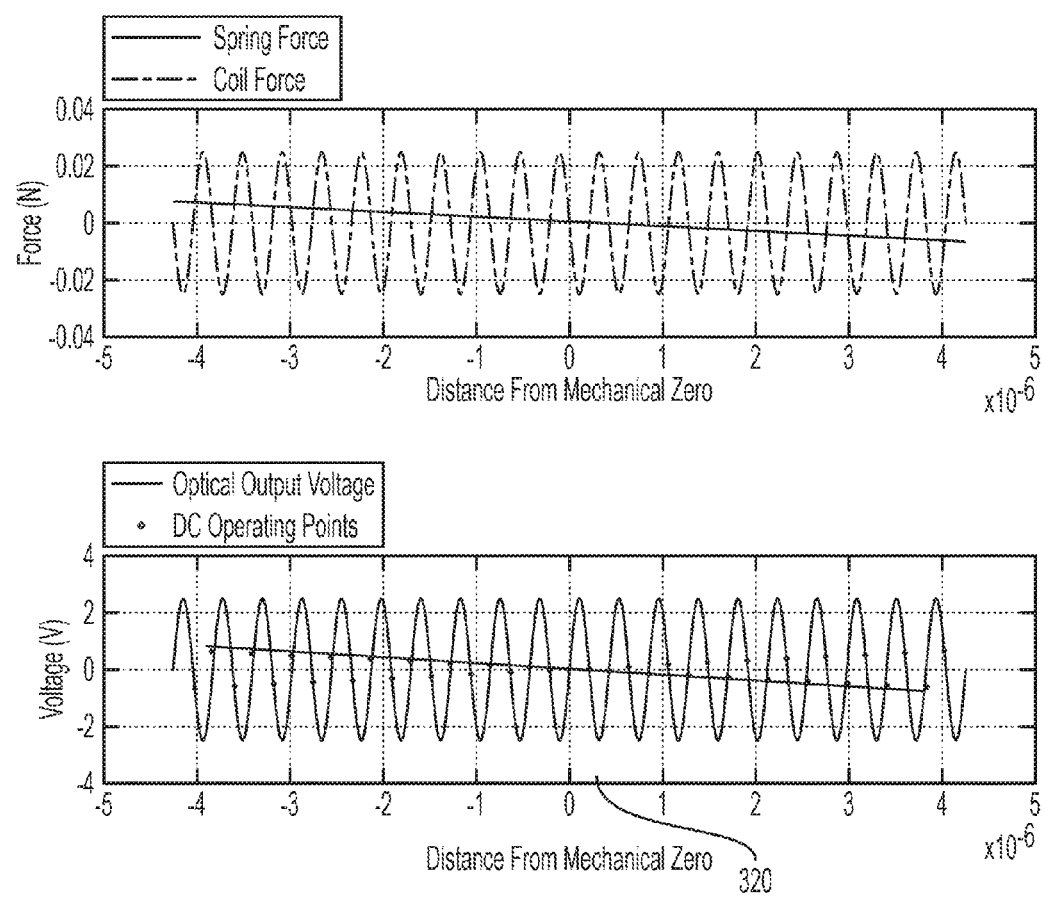
FIG. 4 illustrate the mechanical force and the voltage as a function of the distance from mechanical zero, in accordance with an embodiment.

As shown in FIG. 4, the amount of mechanical force applied by the spring 115 depends, at least in part, on the proof-mass 105 position relative to mechanical zero 320, and the amount of force applied by the feedback coil 110 can be determined by the output of the optical system. For example, to operate at or near mechanical zero, the system can apply an offset power (e.g., DC offset or current offset) such that the proof-mass 105 operates at or near mechanical zero or within a fringe. When the system 100 is operating on a non-ideal fringe (i.e., located at one or more fringes away from mechanical zero 320) sensor performance may be negatively affected. For example, increased offset voltage can mean reduced dynamic range, increased power consumption, and reduced random intensity noise cancellation.

Accordingly, in some cases, the system is configured to operate at a fringe located closest to mechanical zero 320 to minimize the mechanical spring force and offset voltage. However, in some cases it may be desirable to operate on a fringe away from mechanical zero. For example, the output response at the fringe closest to mechanical zero may be distorted due to some imperfection in the system optics, while another fringe is relatively free from imperfection. In such cases, it may be desirable to operate on the latter fringe.

The operating fringe can be monitored by reading the offset voltage and can be changed with a variety of methods in response to various conditions as described herein. For example, the system 100 may experience mechanical drift due to acceleration caused by, e.g., spring settling, temperature expansion, etc. Referring to FIG. 3A, drift can cause the voltage output curve 305 to translate laterally in either direction. When force feedback is applied, the system 100 can lock onto one fringe. However, in the event mechanical drift occurs, this fringe may drift substantially away from the ideal fringe, causing a corresponding drift in the feedback coil 110 offset voltage. The techniques described herein may correct for drift by shifting the operating point from the drifted fringe back to a fringe closer to mechanical zero.

In some embodiments, if the sensor receives a large enough signal to overwhelm the control system (e.g., a temporary mechanical shock) the proof mass 105 may move beyond the fringe it is operating on. This may result in the control system no longer operating as an overdamped mechanical oscillator. Instead, the sensor may exhibit open-loop characteristics (for instance oscillating at the open loop natural frequency). As the input acceleration settles, the system can re-lock on to a fringe. This fringe may or may not be ideal, and may have substantial offset voltage. The techniques described herein my be used to correct for drift by shifting the operating point from the drifted fringe back to a fringe closer to mechanical zero.

Figure 5A:
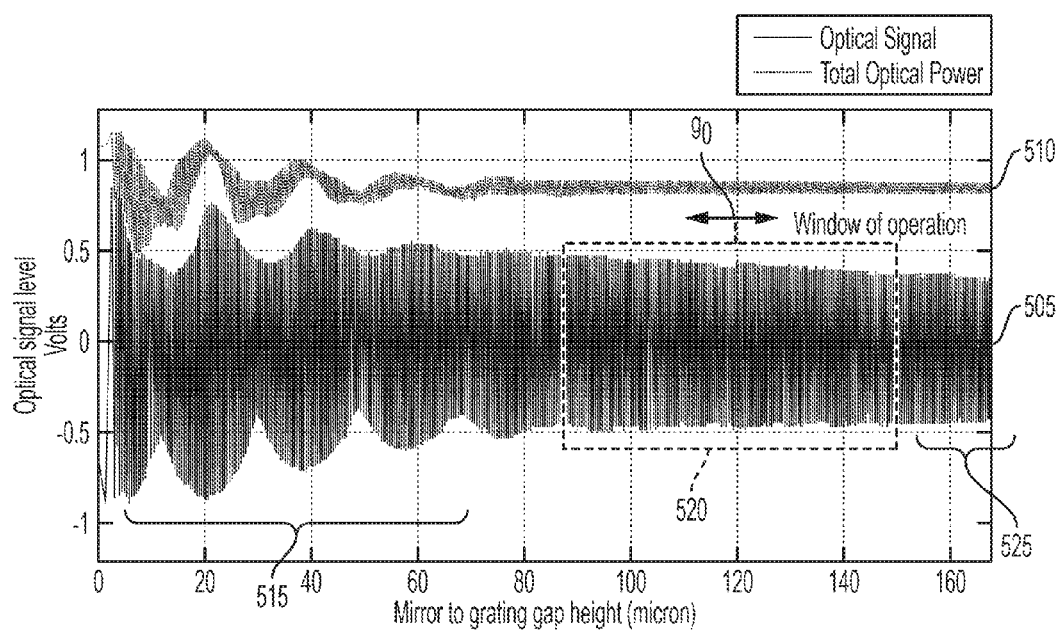
FIGS. 5A & 5B are illustrative graphs of the optical signal non-idealities, in accordance with an embodiment.

FIG. 5A is an illustrative graph of the optical signal non-idealities (e.g., non-linearity and decaying envelope) in accordance with an embodiment. In this illustration, the graph plots the optical signal level (volts) versus the mirror to grating gap height (microns), for the optical signal level 505 and the total optical power 510. Referring back to an embodiment illustrated in FIG. 1A, the mirror to grating gap height may be the distance 122 between mirror 120 and diffraction grating 150.

In this example, when the mirror to grating gap height 122 is between 0 and approximately 70 microns, the system may exhibit non-linear optical behavior where the optical signal level 505 has an envelop as high as −0.8 to 0.8 volts or more, and oscillates between this envelope.

Accordingly, the corresponding total optical power graph 510 shows the optical power varying in this non-linear region. This region of non-linear optical linear behavior 515 may be the result of one or more factors, including, e.g., internal reflections. Within the region 515, as the gap height 122 increases from 0 to 70 microns, the envelope may decay from −0.8 to 0.8 volts to approximately −0.6 to 0.6 volts.

Thereafter, as the gap height 122 increases beyond approximately 70 microns, the system may achieve static equilibrium where the proof mass falls within a satisfactory window of operation 520. In this example, the system can operate in static equilibrium when the gap height 122 is between approximately 85 microns and approximately 150 microns. Furthermore, the total optical power 510 in the window of operation 520 remains steady at, e.g., approximately 200 microWatts. The optical signal continues to decays as the gap height increases beyond 150 microns, as shown ion region 525.

Figure 5B:
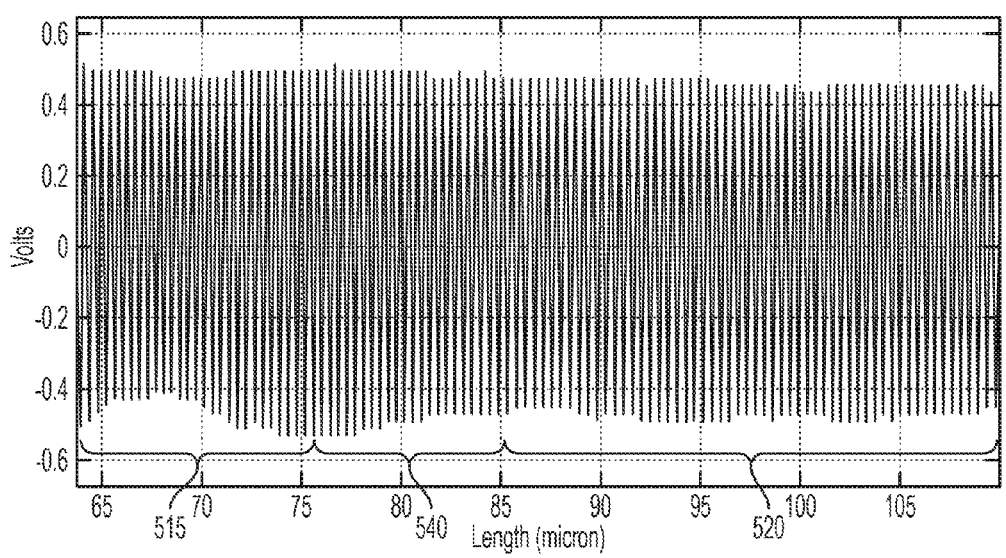

FIG. 5B shows a zoomed-in view of the optical curves that highlights the optical signal as it transitions from the non-linear region 515 to the window of operation region 520. Region 540 represents a region between the non-linear region 540 and the window of operation region 520 where the envelope has decayed substantially, but not yet reached a static equilibrium.

Fringe Selection Techniques

As noted above, as the system 100 operates in fringes that are farther from mechanical zero, the mechanical spring force increases, which can increase the DC offset. In some embodiments, an increased DC offset may increase power usage and adversely impact the dynamic range when the analog optical read out signal is converted to a digital signal, e.g., using an analog to digital converter (ADC). Furthermore, depending on the performance of the optical system, some fringes may not be sufficiently linear and/or may not have sufficient optical modulation.

Referring to FIG. 6, an electronic circuit used to provide coil polarity toggling to allow fringe selection is shown. The circuit can include two positive coil drives 605 and 615 coupled to opposing ends of the coil 110 via a switch or toggle 620 and 625, and a negative coil drive 610 coupled to both the positive coil drives 605 and 615 via the switches 620 and 625. When the polarity of the feedback coil 110 is reversed via switches 620 and 625, the operating point of the system 100 moves to the closest opposite polarity slope of the output voltage response curve.

Because the mechanical spring 115 applies force in the direction of mechanical zero, the system may move one fringe in that direction. The system is stable at either polarity.

This process can be repeated, hopping one fringe per repetition, until the system 100 arrives at a desired fringe, e.g., the fringe at or near mechanical zero. Operating on this fringe may result in a lower DC offset and reduce power consumption while maximizing dynamic range.

In various embodiments, toggling can be accomplished by using an analog switch (e.g., a MOSFET transistor), relay, or any other electronic switching technique 620. This switching technique 620 can be initiated by a microcontroller, analog circuit, digital circuit, or any other type of logic include in the readout electronics 200.

Note that typically, polarity toggling will only move the mass towards mechanical zero. This is advantageous for reducing offset, but may not provide a solution to problems with fringe linearity or modulation.

In some embodiments, the selected fringe can be adjusted either towards mechanical zero or away from mechanical zero via an injection current applied to the coil 110. For example, to reduce offset, the mass can be can be pushed to a fringe that is closer to mechanical zero. In another example, if a fringe that the sensor is operating on has poor linearity or modulation, the surge current can be used to push the mass to a nearby fringe that has better properties. The surge current can adjust the fringe by sending a sufficiently large surge of current through the coil that temporarily overwhelms the feedback system. The injection current pulse can be calibrated to push the mass a number of fringes in either direction. In some embodiments, the system 100 can reduce the loop gain to facilitate adjusting the operating fringe. In some embodiments, the operating fringe can be adjusted by mechanically moving the proof mass, e.g., using a mechanical servo.

In some embodiments, fringe selection may be accomplished using open loop toggling. By opening the feedback loop, the system may respond to ground motion according to its open loop transfer function. Upon reapplying feedback control, the system can then fringe lock on the nearest operating point, which may be close to mechanical zero. Open loop toggling can be implemented in a number of ways, including, e.g.,: temporarily disconnecting the feedback loop (using a switch, relay, etc.), temporarily disabling the optical displacement sensing (e.g., by disabling the laser or photodetectors), or temporarily removing or reducing power from system.

In general, open loop toggling is advantageous in that it may be easy to implement, but offers limited ability to control the resulting operating fringe.

Fringe Counting

In order for the system to determine when to change fringes, capability for analyzing the status of the current fringe may be provided, e.g. using the techniques described below.

For applications where only voltage offset reduction is desired, the system can monitor fringe location by reading DC offset using any suitable technique, e.g., using a microcontroller, comparator, volt meter, etc.

In some embodiments, the system 100 includes a secondary detector configured to measure the displacement between the housing and proof mass (e.g., by measuring the gap between the mirror and grating as shown in FIG. 1). The secondary detector can be configured to resolve the displacement at distances corresponding to the wavelength of the laser. This technique is particularly useful if an integrator is used in the feedback loop used to lock to a fringe. An integrator can remove the DC offset voltage from the output (obviating the need for DC offset monitoring), but would not solve all of the inherent issues involved with electromagnetically holding the mass away from its natural resting point such as increased power consumption. In such cases the secondary detector can be used to determine if the system is operating at a fringe away from mechanical zero, and cause adjustments to be made accordingly.

In some embodiments, the system 100 can evaluate fringe quality, e.g., identifying nonlinearity or poor modulation in a fringe. For example, the modulation efficiency or linearity of a fringe can be determined by conducting a sweep of the optical response curve. The optical sweep can be performed by opening the feedback loop and actuating the proof mass through several fringes while measuring the generated output voltage signal from the optical readout system. The resulting waveform may be analyzed using any suitable technique including, e.g., by using an ADC, comparator scheme, Schmitt trigger, etc. From this result, the modulation efficiency and linearity of a fringe can be determined. In some embodiments, the optical sweep is performed periodically during the deployment of the sensor using internal components of the sensor. In one embodiment, the optical sweep is performed prior to deployment, e.g., using an external testing set up, and the results stored on board the sensor for use.

Photocurrent Subtraction

As described with reference to FIGS. 1 and 2, in some embodiments, the proof mass position signal is determined based on the difference between the inside (zeroth) and outside (first) optical orders of the optical interference pattern. In some embodiments, the readout electronics 200 can be configured to determine this difference. This difference signal represents the system's output as well as the feedback loop error signal. In some embodiments, the laser's random intensity noise (RIN) will be captured in each order. Subtracting these signals works to cancel out RIN.

Figure 9:
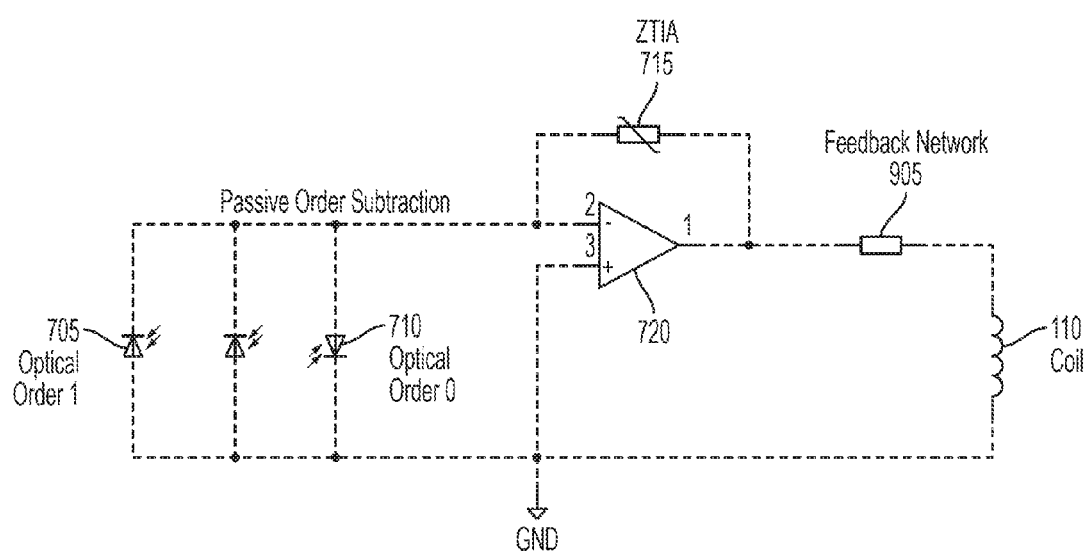

FIGS. 7-9 show circuit implementations for various subtraction schemes. In brief overview, FIGS. 7-8 show implementations of techniques where each photocurrent can be amplified and conditioned independently. For example, FIG. 7 illustrates an implementation of a differential coil drive technique where the two optical orders 705 and 710 can be placed on opposite terminals of the feedback coil 110 and the system output (acceleration, velocity, etc.) can be presented as a balanced signal pair and be fed into a differential amplifier. In another example, FIG. 8 illustrates an implementation of an active photocurrent subtraction technique where the two resulting voltages can then be subtracted in an analog or digital circuit, which can either be ground-referenced or differential, and can supply amplification. In yet another example, FIG. 9 illustrates an implementation of passive photocurrent subtraction where the photocurrents from each optical order can be placed in parallel with opposite polarities.

Referring to FIG. 7, and in further detail, the circuit may include a plurality of photodiodes 705 corresponding to the first optical order and a photodiode 710 corresponding to the zeroth optical order. For example, the first optical order may include two peaks that may be detected by the two photodiode while the zeroth optical order may include one peak detected by a single photodiode. The photodiodes 705 of the first optical order may be coupled to the V_ or inverting terminal of an operational-amplifier ("op-amp") 720. Negative feedback may be provided by resistors and 715 (e.g., a resistor, or an analog or digital variable resister/potentiometer that can adjust a trans-impedance gain) coupled to the non-inverting input terminal and $V_{out}$. Similarly, the output of the photodiode corresponding to the zeroth optical order 710 may be coupled to the non-inverting input of a op-amp 725. Op-amp 725 may include a negative feedback resistor 730 (e.g., a resistor, or an analog or digital variable resister/potentiometer that can adjust a trans-impedance gain) coupled to the non-inverting input terminal and $V_{out}$. The output of the op-amps is directed to the feedback network 740 and 735 used for closed loop control of the signal provided to the coil 110.

FIG. 8 shows an active photocurrent subtraction technique. The photocurrents representing optical order 1 705 and optical order 0 710 are amplified and conditioned independently. For example, the optical order 1 705 photocurrent can be amplified and conditioned via amplifier 720, and the optical order 0 photocurrent 710 can be amplified and conditioned via amplifier 725. The two resulting voltages are then subtracted in an analog or digital circuit. This circuit can be either ground-referenced or differential, and may also apply amplification. For example, the difference between the resulting voltages can be obtained via differential amplifier 810. The output of the op-amp 810 is directed to the feedback network 815 used for closed loop control of the signal provided to the coil 110.

FIG. 9 shows a passive photocurrent subtraction technique. The photocurrents from each optical order can be placed in parallel with opposite polarities. For example, the photocurrent representing optical order 1 705 is in parallel with the photocurrent representing optical order 0 710. The difference between the photocurrents 705 and 710 can take place in the current domain and this resulting difference current can then be amplified in a single amplifier (e.g. a trans-impedance amplifier—"TIA") 720 and 715, presenting an output and a feedback voltage. The output of the amplifier 720 is directed to the feedback network 905 used for closed loop control of the signal provided to the coil 110.

Modulation Correction

As noted above, in some embodiments, all fringes do not have the same detection sensitivity. Fringe detection sensitivity (e.g., amps/m/s/s) may vary based on the mirror/grating gap (tilt angle), manufacturing tolerances, and/or other factors. Detection sensitivity decreases as the gap between the mirror and grating increase. Thus, there may be a decline in detection sensitivity when the sensor is positioned in an orientation such that gravity pulls the grating and mirror apart. Changes in detection sensitivity affect the dynamic range of the closed-loop system.

In some embodiments, the amount of photocurrent received by each order in the interference pattern may not be equal. This can vary by design, manufacturing tolerances, tilt angle, and other issues. If photocurrent signals are not balanced, system dynamic range is compromised because the more sensitive order will be more prone to clipping the amplifier. Secondly, RIN cancellation (as described above with reference to photocurrent subtraction) may be improved or maximized when each order is equal Several techniques may be used to mitigate or eliminate these issues, including, e.g., variable TIA gain, Post-TIA gain, a shunt resistor, post-TIA voltage divider, or a current mirror/active photocurrent balance scheme. For example, in the variable TIA gain stage, variable gain amplification can be provided by a variable resistor or potentiometer placed in the TIA feedback loop. In some embodiments, other programmable gain amplifier schemes, a suitable logic element or other control electronics can set TIA gain accordingly. FIGS. 7 and 8 illustrate techniques where separate variable gain TIAs (e.g., 715 and 730) are provided for the zeroth order photodiodes and the pair of first order photodiodes. FIG. 9 shows a scheme where a single variable gain TIA 715 is provided after the zeroth and first order photocurrents have been subtracted in the current domain.

Figure 10:
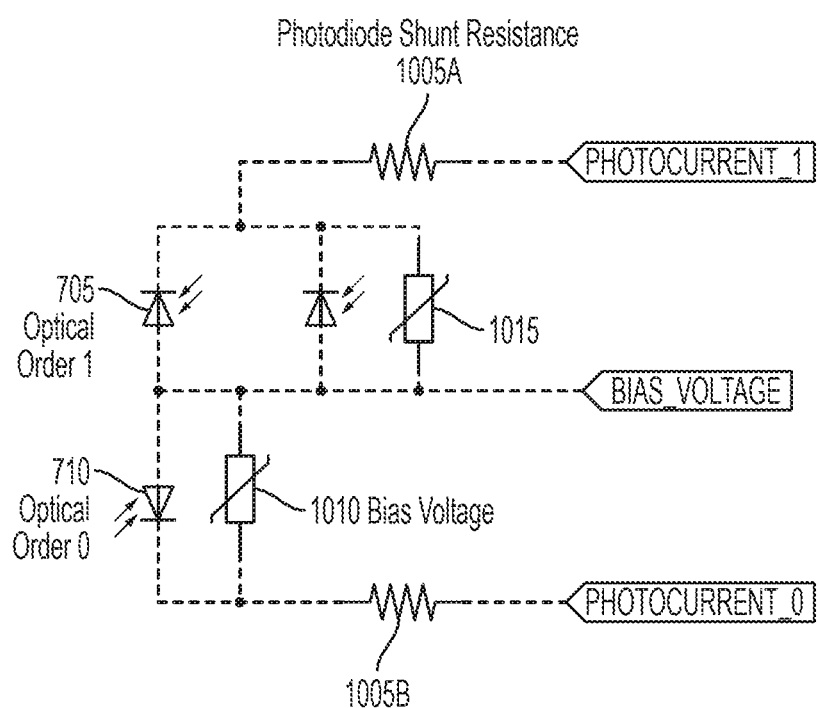
FIG. 10 illustrates a shunt resistor technique to adjust gain in accordance with an embodiment.

FIG. 10 shows a shunt resistor technique to adjust TIA gain in accordance with an embodiment. In this illustration, a resistor 1015 and 1010 (e.g., a variable resistor or a potentiometer) can be placed in parallel with one or both photodiodes to siphon off photocurrent as necessary to balance the two orders.

Other techniques may include a post-TIA gain stage where an additional variable gain stage can be placed after the TIA using similar methods; a post-TIA voltage divider where a variable voltage divider can be placed after the TIA stage (but before subtraction) to adjust the photovoltages until the zeroth and first order signals are balanced; and a current mirror/active photocurrent balance scheme or any other suitable active circuit designed to be used to balance photocurrents.

Non-modulated Photocurrent Removal

As will be apparent to one skilled in the art, in some embodiments, the detection photodiode output will include a non-modulated photocurrent component that is not a function of grating and mirror position. This component may be caused, e.g., by stray light within the sensor housing (e.g., from secondary reflections in the optical system). This non-modulated photocurrent is not useful as signal, but nonetheless gets amplified by the TIA, and can cause the amplifier to clip.

In various embodiments, the following techniques may be used to reduce or eliminate the non-modulated photocurrent.

In some embodiments, passive photocurrent subtraction may be used to reduce or eliminate constant photocurrent in the current domain, preventing problems with amplifier circuit.

Figure 11:
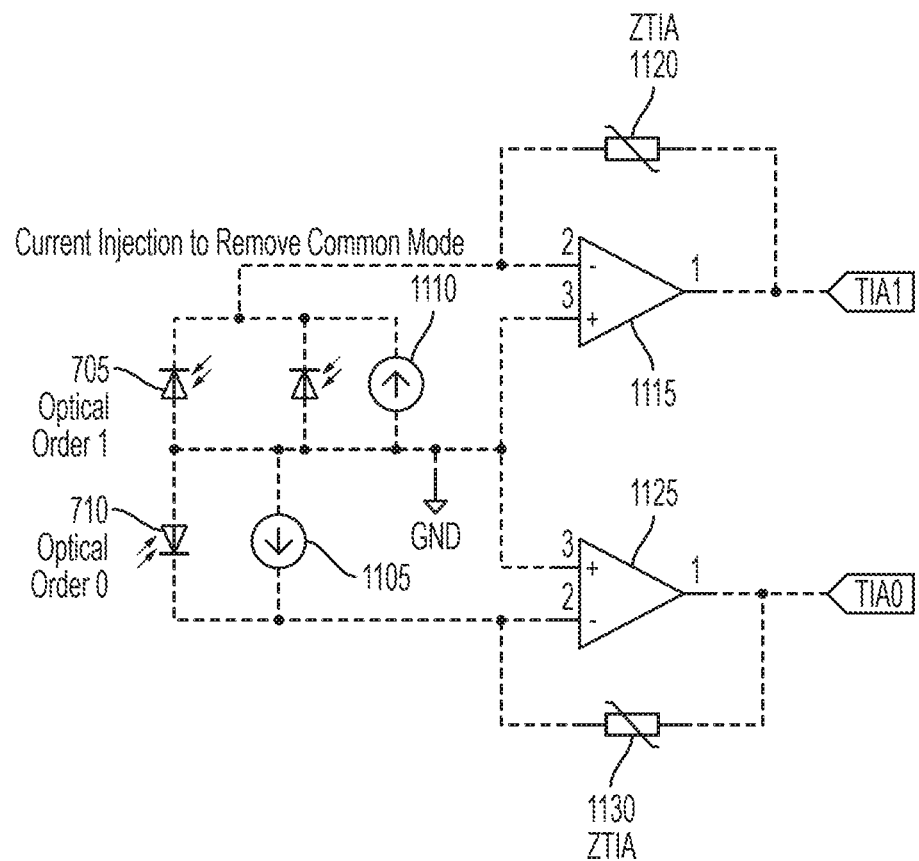
FIG. 11 illustrates an opposing current injection technique that can be used to reduce or eliminate the non-modulated photocurrent in accordance with an embodiment.

FIG. 11 illustrates an opposing current injection technique that can be used to reduce or eliminate the non-modulated photocurrent in accordance with an embodiment. As shown, a current source 1105 and 1110 (using any suitable topology, possibly variable) can be placed in parallel with each photocurrent signal 705 and 710 to remove the non-modulated or constant component. The resulting individually conditioned photocurrent can be individually amplified via amplifiers 1115 and 1125.

In some embodiments, in addition or alternative to the above techniques, the amplifier voltage can be increased such that the amplifier can no longer clip, providing a "brute force" solution to the clipping issue.

Switchable Eddy Current Damping "Handbrake"

Figure 12:
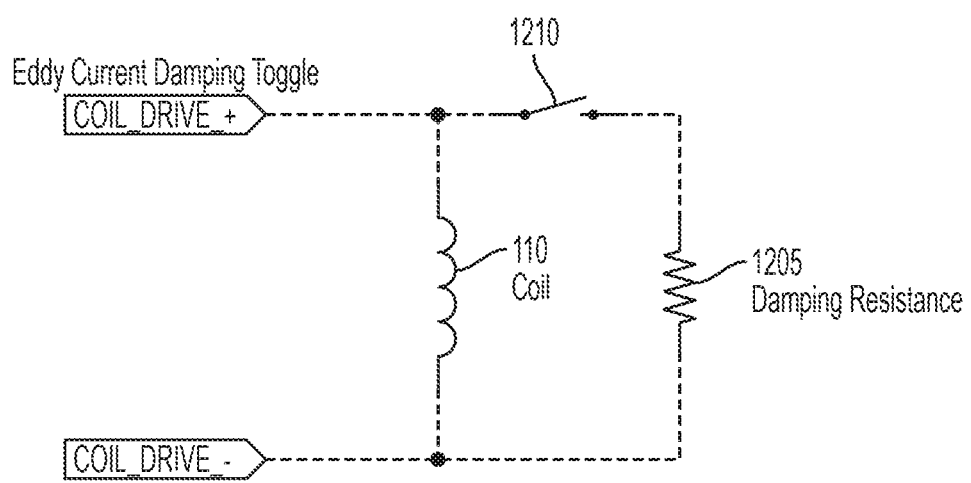
FIG. 12 illustrates a technique for changing the damping of the open-loop system in accordance with an embodiment.

FIG. 12 illustrates a technique for changing the damping of the open-loop system in accordance with an embodiment.

As noted above, in some cases it is desirable to turn off closed loop feedback and allow the system to operate open loop, and/or change the damping of the open-loop system in real-time. As shown in FIG. 12, and in some embodiments, variable open-loop damping can be provided by shunting the coil 110 to a damping resistance 1205. This damping resistance 1205 may be variable, and it can be placed in series with a switching element 1210 such as an analog switch or relay. The switching element 1210 can be modulated, e.g., with a selected duty cycle or a selected frequency. The shunt, when switched into the circuit, provides increased damping, thereby operating as a so-called "handbrake" to the mechanical system.

This handbrake may be used in several applications including the following. The handbrake may be activated when using coil polarity toggling (e.g., for fringe selection) to prevent unwanted oscillations. The handbrake may be activated when system is receiving large signals (e.g., a temporary mechanical shock) to aid clip recovery. The handbrake may be activated when system is powered off to reduce damage from vibrations during shipping. The handbrake may be activated if the system becomes unstable or oscillates.

Real-time Adjustment of Loop Gain

In some applications, it may be desirable to precisely adjust the amount of loop gain in the system in real-time. In some embodiments, the feedback network that determines loop gain can contain variable components. In addition, analog switches or relays can be placed in the feedback loop and toggled with a duty cycle and frequency.

Applications include reducing loop gain when attempting to reposition proof mass as described in the section titled Fringe Selection above. This reduces the amount of force required to overwhelm the feedback system. Also, when transitioning from open-loop to closed-loop (for instance after power on), loop gain can be steadily increases rather than suddenly turned on to its full value.

In some embodiments, it may be advantageous to measure and control the nominal gap spacing between grating and mirror in an effort to adjust the set point or operating point of the sensor. For example, in some embodiments, there is a natural sag of the proof mass due to its own weight. The level of sag depends on the orientation and inclination of the sensor. It may be advantageous for the sensor to achieve the same operating point regardless of inclination, and this "tilt compensation" can be achieved through one or more the following techniques. As a way to sense sag, a secondary sensor (e.g. an inclinometer) may be used to sense inclination which is correlated with sag. As a way to sense sag, use wavelength of optical readout light as a length measurement through periodicity properties of the optical curve to set optimal gap. As a way to control the nominal gap spacing between grating and mirror, actuate diffractive optical element using any of suitable actuators (i.e. piezoelectric, magnet coil, electrostatic, motor drive, pneumatic) to achieve nominal gap distance. As a way to control the nominal gap spacing between grating and mirror, actuate mirror using any suitable actuator (i.e. piezoelectric, magnet coil, electrostatic, motor drive, pneumatic) to achieve nominal gap distance. As a way to control sag, coil on bobbin may be driven with a current to levitate bobbin at desired position.

Various embodiments described herein use of optical elements (e.g., a mirror and a grating) mounted to the proof mass and the housing to provide optical readout of the relative displacement between the proof mass and the housing. These optical elements may include various features or techniques to provide the optical readout. For example, the optical element can include a ruled grating on an optically transparent substrate for splitting light into two beams (a reflected beam and a transmitted beam). The substrate can be made transparent using anti-reflective coating. In some embodiments, the ruled grating can include two layers, where a $1^{st}$ layer reflects at a $1^{st}$ rate and a $2^{nd}$ layer reflects at a $2^{nd}$ rate. In some embodiments, the rulings of the ruled grating can be of a fixed pitch. For example, the pitch of the rulings can be based on the width of the ruling line ("x") and the gap width between ruling lines ("y"), where the pitch is equal to x+y.

In some embodiments, the top of the ruled grating may include a thin protective layer which prevents ruling lines from making contact with reflecting mirror surface. In this or other embodiments, the protective layer may be fabricated on the surface of the mirror.

Optical Sensor

Figure 13:
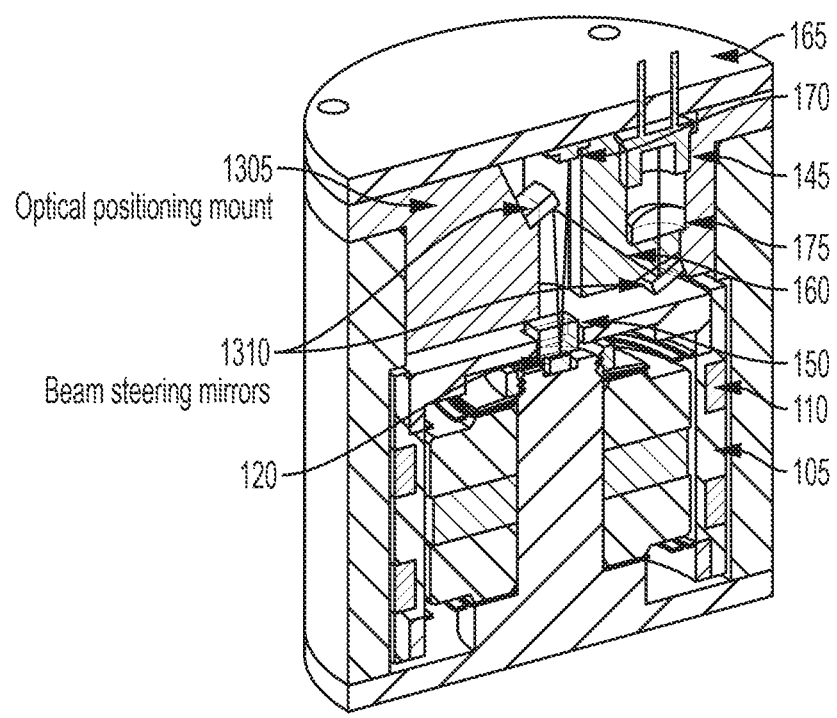
FIG. 13 illustrates a system that actively guides light from an optoelectronics board to a grating in accordance with an embodiment.

Referring to FIG. 13, an illustration of a system that actively guides light from the optoelectronics board 165 to the grating 150 in a closed loop scheme in accordance with an embodiment is shown. For example, one or more of the lens, light source, and optoelectronic board may be mounted on a servo (e.g., magnetic or piezoelectrically actuated) to guide the light ray 160. To sense the success of the alignment, a current may be fed to the bobbin coil 110 to actuate or vibrate the bobbin 105 while reflected beams are monitored.

In some embodiments, it may also be advantageous to control the planarity between mirror 120 and grating 150 surfaces. Mirror 120 and/or grating 150 inclination may be actuated using magnetic or piezoelectric actuation to control planarity. Properties of the reflected beams may be measured and monitored at the optoelectronic board to determine when planarity is adjusted to a desired location. The coil may be fed current to create a signal for use in this adjustment.

In some embodiments, the system may include optical positioning mount 1305 and beam steering mirrors 1310 to guide the light beam 160.

Figures 14A, 14B:
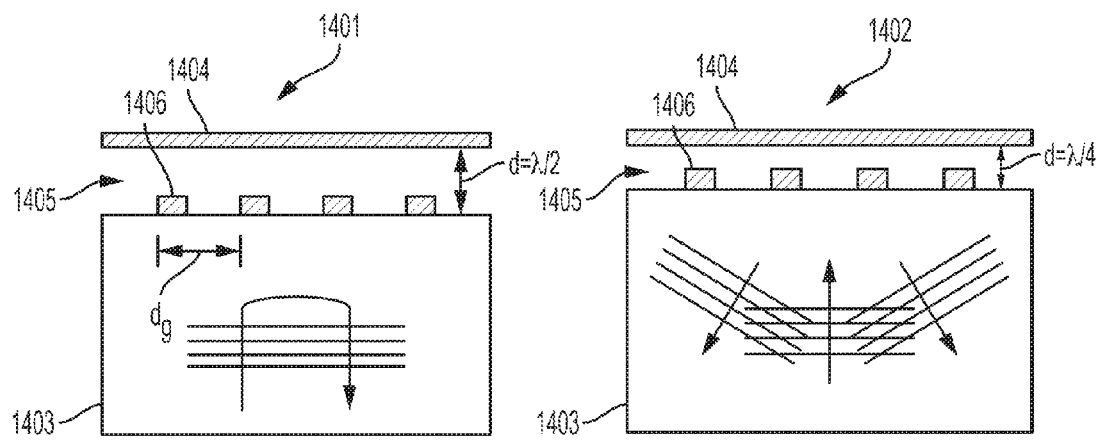
FIGS. 14A-B illustrate concepts of using a diffraction grating to split beams in a microinterferometer, in accordance with an embodiment.

FIGS. 14A-B illustrate concepts of using a diffraction grating to split beams in a microinterferometer. This concept has been utilized in measuring precise relative displacements and is disclosed in U.S. Pat. No. 7,518,737 entitled "Displacement-measuring optical device with orifice". The diagram of FIG. 14A and FIG. 14B illustrate two scenarios. In FIG. 14A, a first scenario 1401 shows what occurs when a target surface 1404 is placed a distance of a half-wavelength, $\lambda/2$, away from a reference point, in this case, a reflective diffraction grating 1405.

In FIG. 14B, a second scenario 1402 shows what occurs when the target surface 1404 is placed a distance of a quarter-wavelength, $\lambda/4$, away from the diffraction grating 1405. The detailed diffraction pattern of such a structure can be found by applying standard diffraction theory to determine the locations and the dimensions of the photo-detectors or light guide apertures.

In both instances, the reflective diffraction grating 1405 is formed on a transparent substrate 1403. Non-limiting examples of materials that can be used to construct the substrate are quartz, silicon, sapphire, glass, and combinations thereof. The diffraction grating 1405 can be formed of an array of diffraction grating fingers 1406 equally spaced along a front edge of the transparent substrate 1403. The diffraction grating fingers 1406 could have a height on the order of micro- or nano-meters.

In the first scenario 1401, when an incident light is illuminated through the transparent substrate 1403, a first portion of the incident light is reflected from the reflective diffraction grating 1405. A second portion of the incident light is transmitted and diffracted about the diffraction grating fingers 1406. The transmitted and diffracted light reflects off of the target surface 1404 and is measured by a proper detection unit (not shown), such as a photo-detector or a photo-diode. As in scenario 1401, the target surface is placed at a distance of $\lambda/2$ or any integer multiple, thereof. In this case, the zeroth order of the transmitted incident light is reflected back. In general, the zeroth order is the transmitted light that is illuminated directly, in which case no diffraction, or change in direction occurs. The first portion of the incident light, and the second portion of the incident light which has been reflected off of the target surface 1404 interferes with each other. The phase of the two portions of the light waves help form constructive and destructive interference patterns. From the interference patterns, the relative distance between the diffraction grating 1405 and the target surface 1404 can be determined.

In scenario 1402, the same general structure is set up. In this case, the target surface 1404 is placed a distance of $\lambda/4$ away from the diffraction grating 1405. In practice, the target surface 4 may be placed at any integer multiple of $\lambda/4$ and the same general results will occur. When the first portion of the incident light joins with the second portion of the incident light upon reflection, destructive interference cancels out the two. The second portion of the light travels an extra distance of 2 times the distance between the target surface 1404 and the diffraction grating 1403, which results in a phase difference between the two portions of $\pi$, complete destructive interference. On the contrary though, the higher order diffraction fields, such as the first order, can constructively interfere with the first portion of the incident light. As FIGS. 14A and 14B depict, the higher order first and second portions of the incident light are angled and not parallel to the line of illumination, like the zeroth order beam.

Figure 15:
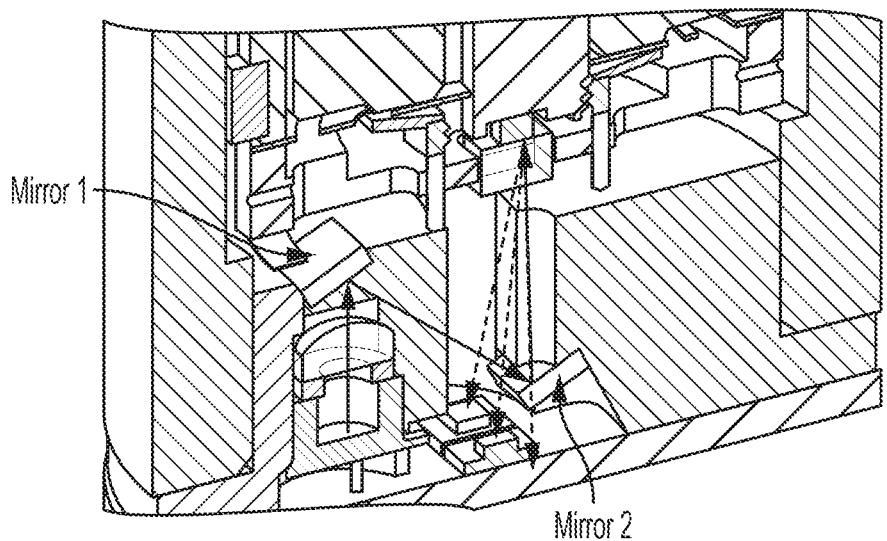
FIG. 15 illustrates a variation of the optical system illustrated in FIG. 13, in accordance with an embodiment.

FIG. 15, illustrates a variation of the optical system illustrated in FIG. 13, where the total beam path length between the source and the diffractive optic element is increased using one or more optical elements (as shown two mirrors). As shown in the lower inset, the overall effect is equivalent to positioning the source at a virtual position at a greater distance from the grating and mirror. In some embodiments, this may advantageously provide improved depth of focus at the grating/mirror.

Figure 16:
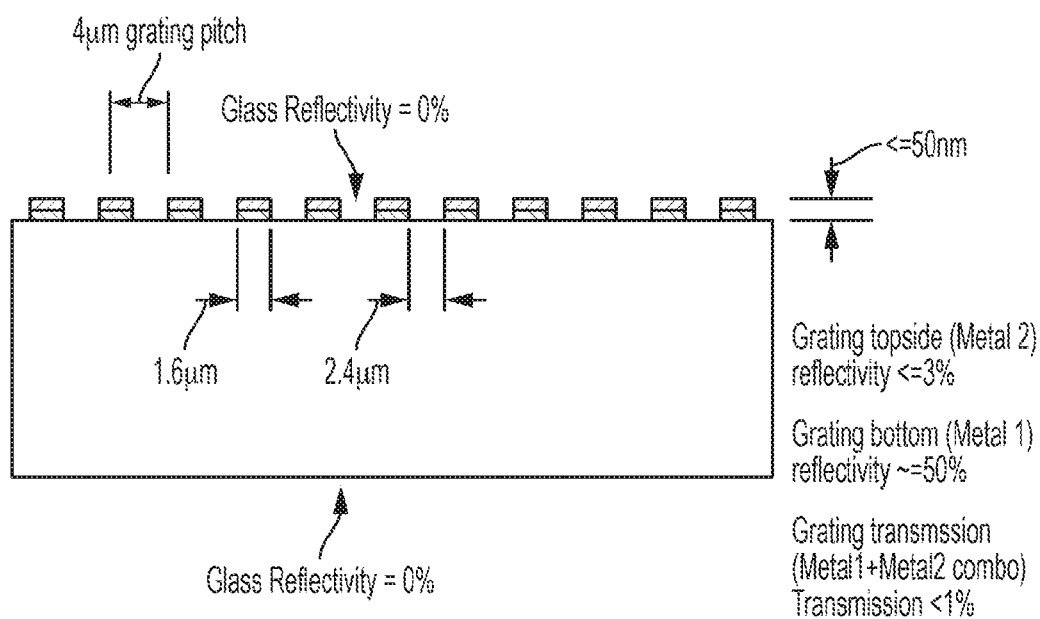
FIG. 16-17 illustrate a specially designed grating that may be used to provide enhanced performance at a targeted wavelength, in accordance with an embodiment.
Figure 17:
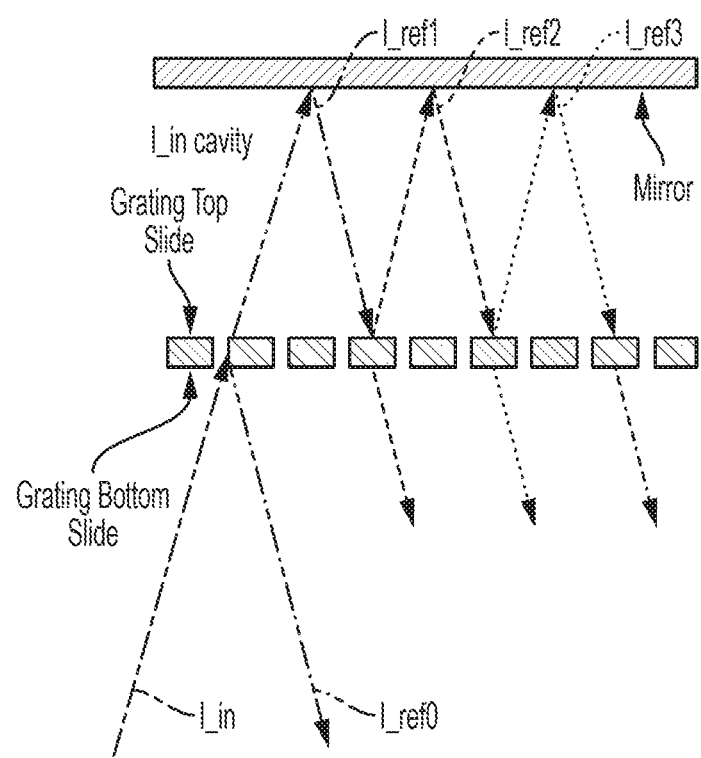

FIGS. 16-17 illustrate a specially designed grating that may be used to provide enhanced performance at a targeted wavelength. The grating includes a substantially transparent substrate (e.g., a glass substrate) on which a lined diffraction grating has been formed. The lined grating is formed as a thin film, e.g., with a total thickness of less than about 50 nm. The grating is formed with a bilayer structure. The top layer is chosen to have relatively low reflectivity (e.g., less than 3%), while the bottom layer has relatively high reflectivity (e.g., about 50% or greater). As shown in FIG. 17, this structure operated to reduce multiple reflections between the grating and mirror, thereby reducing nonlinearities and other unwanted effects in the resulting interference patter. In various embodiments, the dimensions of the grating may be chosen to provide desired performance with a selected wavelength or wavelengths of light. As shown, dimensions are chosen for use with light at 850 nm, but in various embodiments any other suitable dimensions may be used.

Figure 18:
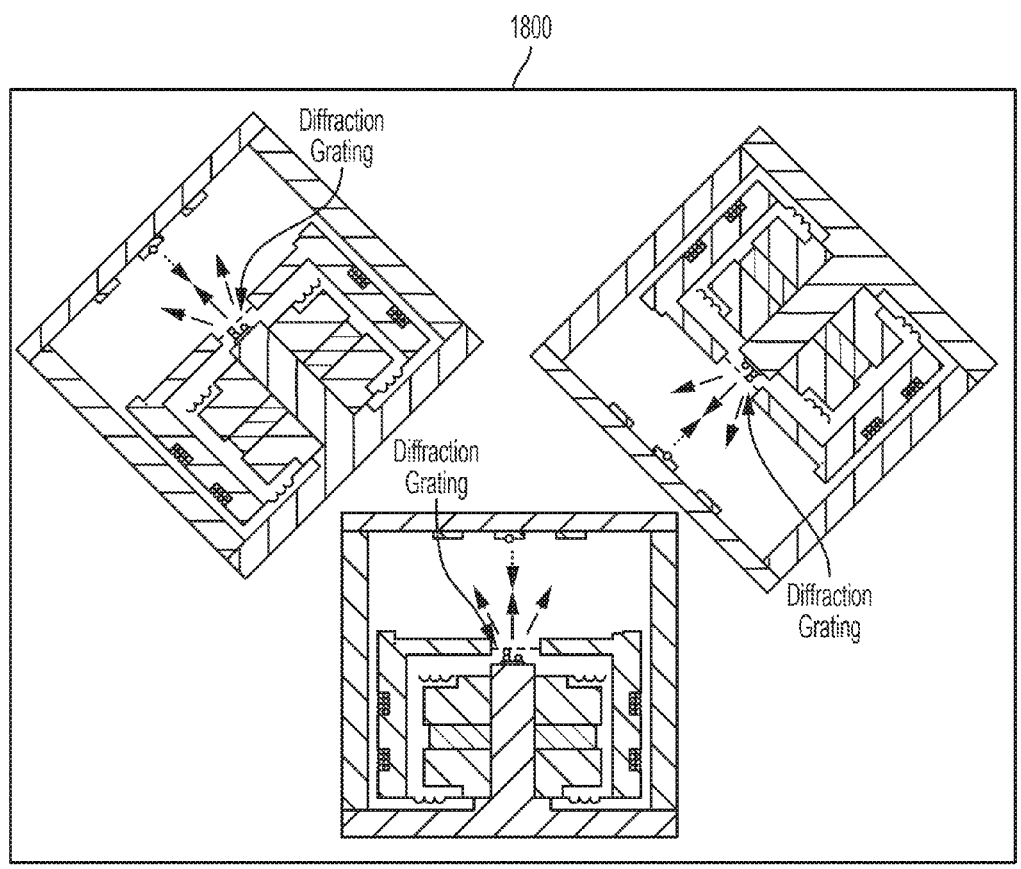
FIG. 18 illustrates embodiments of sensors.

Referring to FIG. 18, one or more sensors of the type described herein may be incorporated in a device 1800. In some embodiments, the device 1800 may be a seismic sensor. For example, in some embodiments, the device 1800 may be a seismic node sensors (e.g., for land or underwater use) of the type available from FairfieldNodal, Inc. of Sugarland, Tex.

As shown, the device includes three sensors which may be oriented transverse to each other, e.g., to detect motion of the device 1800 along three axes. As detailed herein, in various embodiments, the sensors may operate over a variety of tilt angles, or even at all possible orientations. Accordingly, the device 1800 may, in some embodiments, operate properly in a variety of, or in all or substantially all, placement positions. This is advantageous in a variety of applications, e.g., in the case where the device 1800 is a seismic sensor that must be placed on an irregular surface, often under difficult conditions (e.g., deep undersea).

Various embodiments may include any of the above described features or techniques, either alone, or in any suitable combination.

Although the examples shown in FIGS. 1-2 are sensors featuring a bobbin/housing architecture particularly suitable for geophone applications, it is to be understood that in various embodiments, optical read out techniques of the type disclosed herein may be applied to other sensor architectures (e.g., micromachined inertial sensors (MEMS), or any other inertial sensor) including leaf-spring or hinge type spring suspensions. Examples of alternate architectures include those described in Garcia, C. T., Onaran, G., Avenson, B., Yocom, B., and N. A. Hall (2010). *Micro-Seismometers via Advanced Mesoscale Fabrication.* in Proceedings of the 2010 Monitoring Research Review: Ground-Based Nuclear Explosion Monitoring Technologies, LA-UR-10-05578, Vol. 1, pp. 280-288.

Hall, N. A., et al., *Micromachined accelerometers with optical interferometric read-out and integrated electrostatic actuation.* Journal of Microelectromechanical Systems, 2008. 17(1): p. 37-44.

Various embodiments described herein deal with measuring the relative displacements of objects (e.g., a housing and a proof mass). It is to be understood that these techniques may be used in general to obtain information about the relative and/or absolute position and/or motion of these objects including, e.g., speed of motion, velocity, acceleration, etc.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

A computer employed to implement at least a portion of the functionality described herein may comprise a memory, one or more processing units (also referred to herein simply as "processors"), one or more communication interfaces, one or more display units, and one or more user input devices. The memory may comprise any computer-readable media, and may store computer instructions (also referred to herein as "processor-executable instructions") for implementing the various functionalities described herein. The processing unit(s) may be used to execute the instructions. The communication interface(s) may be coupled to a wired or wireless network, bus, or other communication means and may therefore allow the computer to transmit communications to and/or receive communications from other devices. The display unit(s) may be provided, for example, to allow a user to view various information in connection with execution of the instructions. The user input device(s) may be provided, for example, to allow the user to make manual adjustments, make selections, enter data or various other information, and/or interact in any of a variety of manners with the processor during execution of the instructions.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

As used herein, the terms "light", "optical" and related terms should not but understood to refer solely to electromagnetic radiation in the visible spectrum, but instead generally refer to electromagnetic radiation in the ultraviolet (about 10 nm to 390 nm), visible (390 nm to 750 nm), near infrared (750 nm to 1400 nm), mid-infrared (1400 nm to 15,000 nm), and far infrared (15,000 nm to about 1 mm).

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A system for controlling displacement sensors with optical readout, comprising:
   a housing;
   a proof mass configured to move within the housing;
   a light source disposed within the housing;
   a detector disposed within the housing that detects light from the light source and generates, based on the light, an optical signal indicative of a relative displacement between the proof mass and the housing;
   an electromagnetic device configured to influence the relative motion between the housing and the proof mass; and
   a control system configured to:
      identify a period of the optical signal;
      identify a plurality of fringes of the optical signal;
      provide a signal to the electromagnetic device to lock the relative displacement between the proof mass and the housing to a range corresponding to a first fringe of the plurality of fringes of the optical signal; and
      apply a signal to the electromagnetic device to change a first state locked to the first fringe to a second state locked to a second fringe of the plurality of fringes, and wherein the second fringe corresponds to a position closer to mechanical zero of the proof mass and housing system than the first fringe.

2. The system of claim 1, further comprising;
   a diffractive optical element mounted on one of the housing and the proof mass;
   a reflective element on the other one of the housing and the proof mass;
   the light source configured to illuminate the diffractive optical element and the reflective element; and
   the detector detects an interference pattern generated by combined light incident from the reflective element and the diffractive element and generates the optical signal indicative of the relative displacement between the proof mass and the housing.

3. The system of claim 2, further comprising:
   an actuator configured to control a relative orientation between the reflective element and the diffractive element, wherein the reflective element is disposed facing the diffractive element, the reflective element separated from the diffractive element by a predetermined number of wavelengths of light used by the light source; and
   a device configured to prevent the reflective element from contacting the diffractive element during mechanical shock.

4. The system of claim 1, wherein the control system comprises a proportional-differential controller or a proportional-integral-differential controller, and the control system is further configured to:
   use an error signal based at least in part on the optical signal indicative of the relative displacement between the proof mass and the housing.

5. The system of claim 1, wherein the electromagnetic device further comprises a permanent magnet and a coil, the coil forms a portion of the proof mass, the system further comprising:
   an electrical circuit configured to provide an electrical signal to the coil, the electrical signal comprising a frequency tuning component and dynamic component determined based on the optical signal; and
   the control system is further configured to control the electromagnetic device to influence the relative displacement between the proof mass and the housing to correspond to a damped frequency response.

6. The system of claim 1, wherein a portion of the housing is coupled to a ground, and the control system is further configured to detect seismic activity based on the relative motion between the proof mass and the housing.

7. The system of claim 1, further comprising:
a suspension system coupling the proof mass to the housing, the suspension system comprising one or more springs,
wherein the proof mass comprises a bobbin movably disposed about a core member, the bobbin comprising non-conductive material.

8. The system of claim 1, wherein the control system is further configured to:
temporarily lock the relative displacement between the proof mass and the housing to the range corresponding to the first fringe of the plurality of fringes of the optical signal.

9. A system for controlling displacement sensors with optical readout, comprising:
a housing;
a proof mass configured to move within the housing;
a light source disposed within the housing;
a detector disposed within the housing that detects light from the light source and generates, based on the light, an optical signal indicative of a relative displacement between the proof mass and the housing;
an electromagnetic device configured to influence the relative motion between the housing and the proof mass; and
a control system configured to:
identify a period of the optical signal;
identify a plurality of fringes of the optical signal;
provide a signal to the electromagnetic device to lock the relative displacement between the proof mass and the housing to a range corresponding to a single fringe of the plurality of fringes of the optical signal;
suspend closed loop control for a period of time to change a fringe to which the control system is locked; and
resume, upon completion of the period of time, closed loop control to lock to the single fringe.

10. A system for detecting seismic activity, comprising:
a seismic sensor comprising:
a housing;
a proof mass configured to move within the housing responsive to seismic activity;
a light source disposed within the housing;
a detector disposed within the housing that detects light from the light source and generates, based on the light, an optical signal indicative of a relative displacement between the proof mass and the housing;
an electromagnetic device configured to influence the relative motion between the housing and the proof mass; and
a control system configured to:
identify a period of the optical signal;
identify a plurality of fringes of the optical signal;
provide a signal to the electromagnetic device to lock the relative displacement between the proof mass and the housing to a range corresponding to a first fringe of the plurality of fringes of the optical signal, wherein the seismic sensor detects seismic motion based at least in part on measuring the relative displacement of the proof mass and the housing; and
apply a signal to the electromagnetic device to change a first state locked to the first fringe to a second state locked to a second fringe of the plurality of fringes, and wherein the second fringe corresponds to a position closer to mechanical zero of the proof mass and housing system than the first fringe.

11. The system of claim 10, wherein the seismic sensor is a first seismic sensor, further comprising:
a second seismic sensor oriented transversely to the first seismic sensor; and
a third seismic sensor oriented transversely to the first seismic sensor and the second seismic sensor.

12. The system of claim 10, further comprising:
an autonomous ocean bottom node, the seismic sensor disposed within the autonomous ocean bottom node.

13. The system of claim 10, further comprising;
a diffractive optical element mounted on one of the housing and the proof mass;
a reflective element on the other one of the housing and the proof mass;
the light source configured to illuminate the diffractive optical element and the reflective element; and
the detector detects an interference pattern generated by combined light incident from the reflective element and the diffractive element and generates the optical signal indicative of the relative displacement between the proof mass and the housing.

14. The system of claim 13, further comprising:
an actuator configured to control a relative orientation between the reflective element and the diffractive element, wherein the reflective element is disposed facing the diffractive element, the reflective element separated from the diffractive element by a predetermined number of wavelengths of light used by the light source; and
a device configured to prevent the reflective element from contacting the diffractive element during mechanical shock.

15. The system of claim 10, wherein the control system comprises a proportional-differential controller or a proportional-integral-differential controller, and the control system is further configured to:
use an error signal based at least in part on the optical signal indicative of the relative displacement between the proof mass and the housing.

16. The system of claim 10, wherein:
the electromagnetic device further comprises a permanent magnet and a coil, the coil forms a portion of the proof mass; and
the control system further is further configured to control the electromagnetic device to influence the relative displacement between the proof mass and the housing to correspond to a damped frequency response.

17. The system of claim 10, wherein the control system is configured to:
suspend closed loop control for a period of time to change a fringe to which the control system is locked; and
resume, upon completion of the period of time, closed loop control to temporarily lock to the first fringe.

18. The system of claim 10, wherein the proof mass comprises a bobbin movably disposed about a core member, the bobbin comprising non-conductive material.

* * * * *